US012597531B2

(12) United States Patent  
Hsu et al.

(10) Patent No.: US 12,597,531 B2  
(45) Date of Patent: Apr. 7, 2026

(54) PACKAGE STRUCTURE AND METHOD OF MANUFACTURING THE SAME

(71) Applicant: Advanced Semiconductor Engineering, Inc., Kaohsiung (TW)

(72) Inventors: Wu Chou Hsu, Kaohsiung (TW); Hung Yi Chuang, Kaohsiung (TW); Shin-Luh Tarng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 253 days.

(21) Appl. No.: 18/114,181

(22) Filed: Feb. 24, 2023

(65) Prior Publication Data

US 2024/0290515 A1     Aug. 29, 2024

(51) Int. Cl.
| | |
|---|---|
| *H05K 1/02* | (2006.01) |
| *H01B 1/20* | (2006.01) |
| *H05K 1/11* | (2006.01) |
| *H05K 1/18* | (2006.01) |
| *H05K 5/00* | (2006.01) |
| *H05K 1/183* | (2026.01) |
| *H05K 1/185* | (2026.01) |

(52) U.S. Cl.
CPC ............ *H01B 1/20* (2013.01); *H05K 1/0233* (2013.01); *H05K 1/115* (2013.01); *H05K 5/0026* (2013.01); *H05K 1/111* (2013.01); *H05K 1/183* (2013.01); *H05K 1/185* (2013.01)

(58) Field of Classification Search
None
See application file for complete search history.

(56) References Cited

U.S. PATENT DOCUMENTS

| | | | | |
|---|---|---|---|---|
| 6,703,564 | B2 * | 3/2004 | Mori | H05K 3/4602 |
| | | | | 174/262 |
| 6,972,382 | B2 * | 12/2005 | Zollo | H05K 3/4623 |
| | | | | 174/262 |
| 11,239,184 | B2 | 2/2022 | Hsu et al. | |
| 2019/0221365 | A1 * | 7/2019 | Cappabianca | H10D 1/20 |
| 2020/0194168 | A1 * | 6/2020 | Zou | H01F 27/324 |
| 2020/0260586 | A1 * | 8/2020 | Hong | H05K 1/181 |
| 2021/0391284 | A1 * | 12/2021 | Hsu | H01L 23/3128 |
| 2022/0093537 | A1 * | 3/2022 | Radhakrishnan | H01L 25/0655 |
| 2022/0310512 | A1 * | 9/2022 | Do | H01L 23/5227 |
| 2022/0418115 | A1 * | 12/2022 | Hsu | H01L 21/4857 |

OTHER PUBLICATIONS

U.S. Appl. No. 17/956,681, filed Sep. 29, 2022, Hsu et al.

* cited by examiner

*Primary Examiner* — Ishwarbhai B Patel

(74) *Attorney, Agent, or Firm* — Foley & Lardner LLP

(57) ABSTRACT

A package structure and a method of manufacturing the same are provided. The package structure includes an electronic component and a first connection element. The electronic component includes a conductive wire and a magnetic layer encapsulating the conductive wire. The first connection element is electrically connected to the conductive wire. The first connection element is disposed outside the magnetic layer.

9 Claims, 42 Drawing Sheets

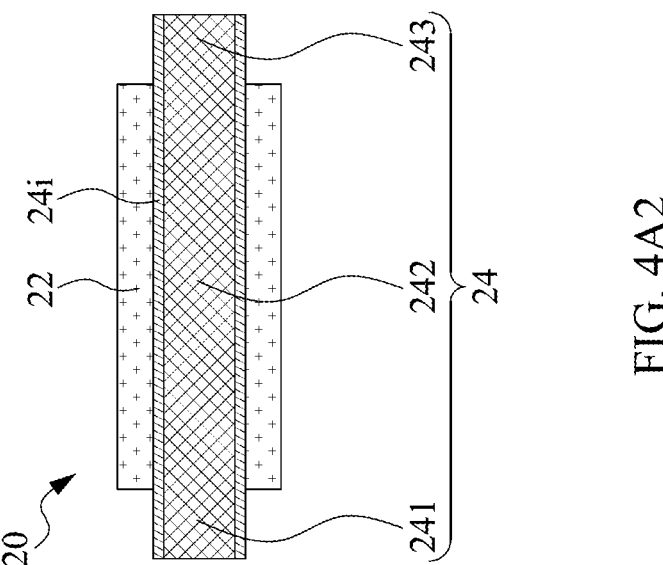
FIG. 4A2
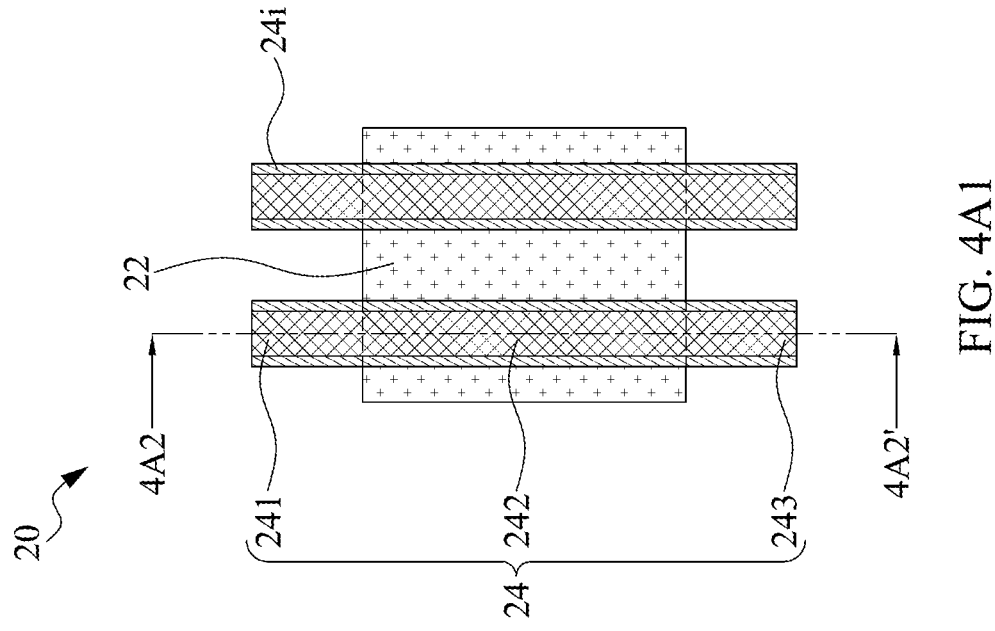
FIG. 4A1

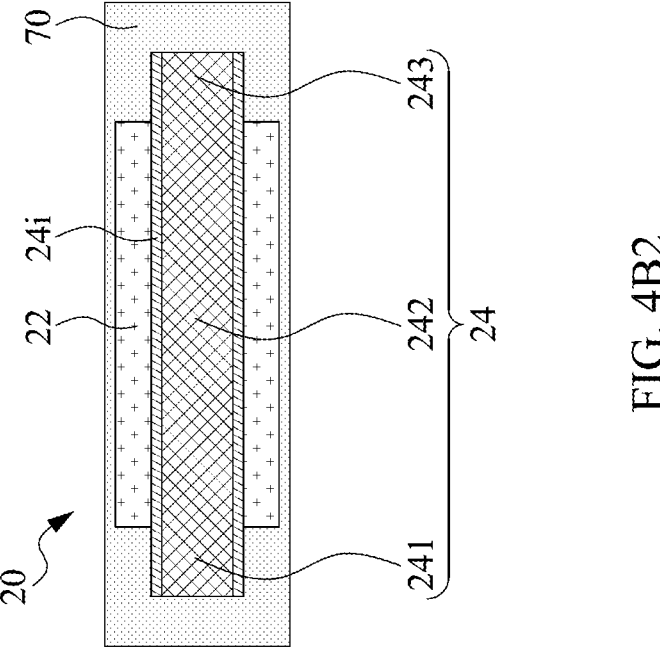
FIG. 4B2
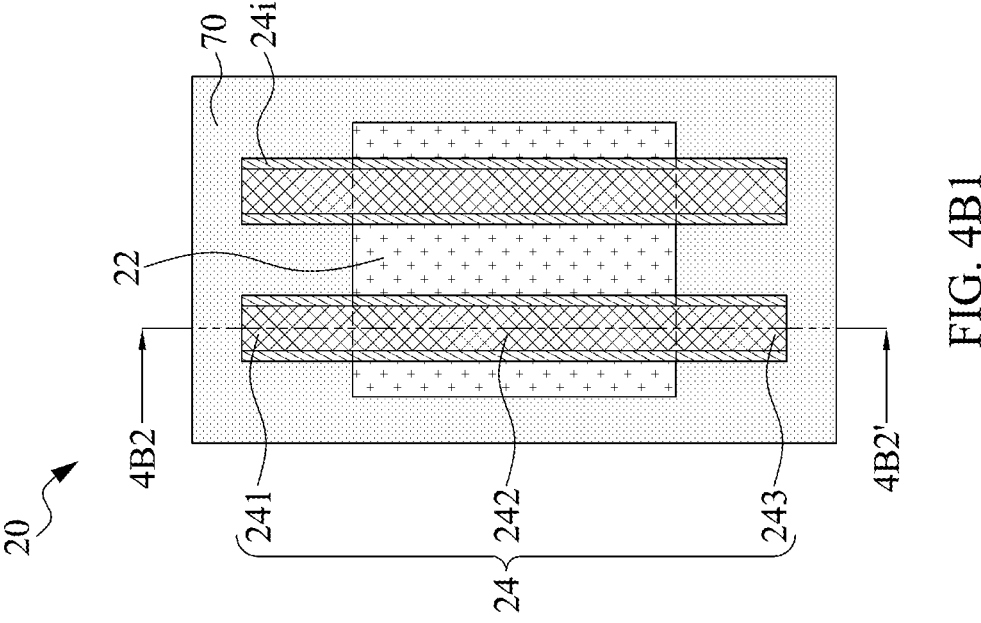
FIG. 4B1

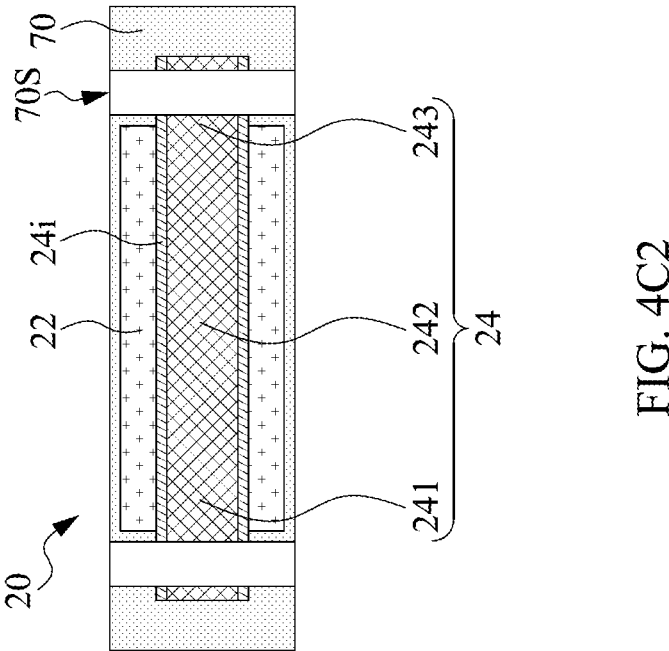
FIG. 4C2
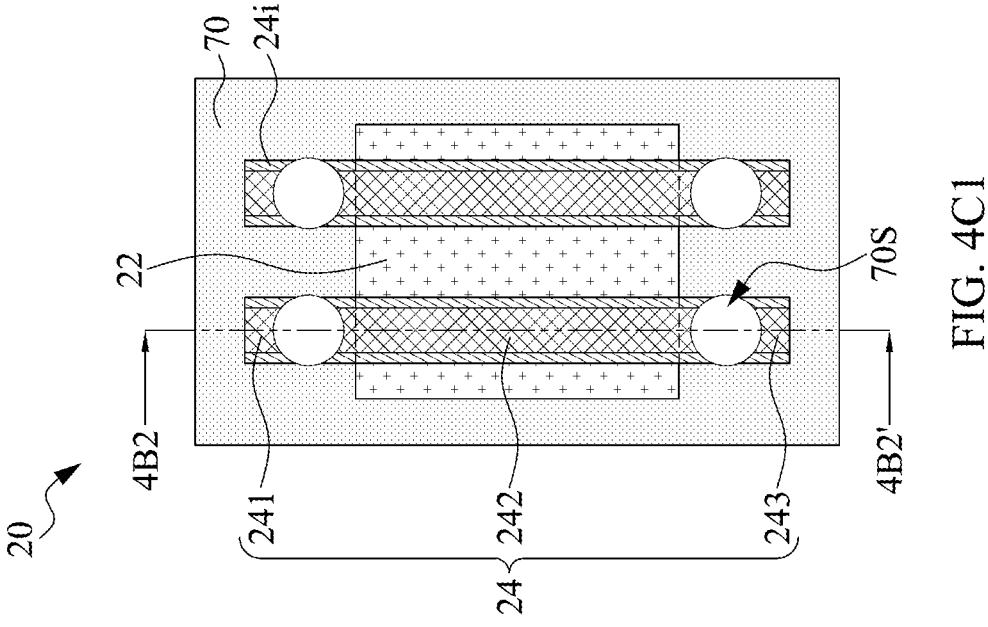
FIG. 4C1

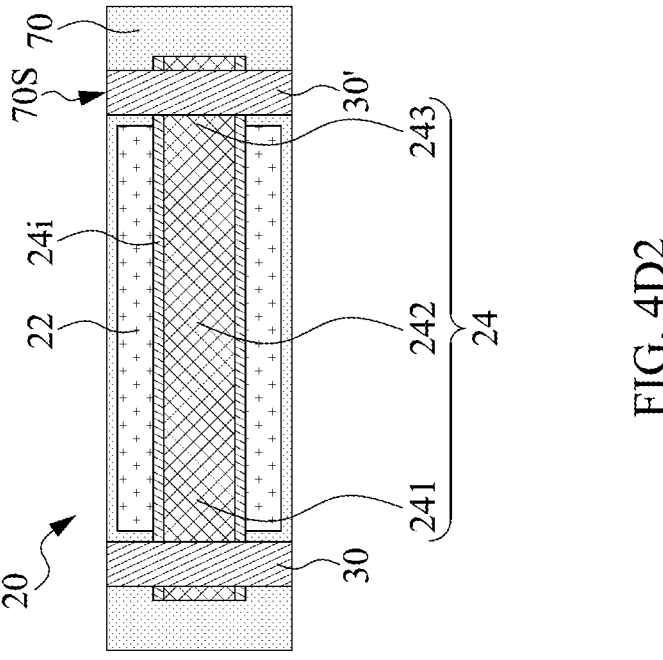
FIG. 4D2
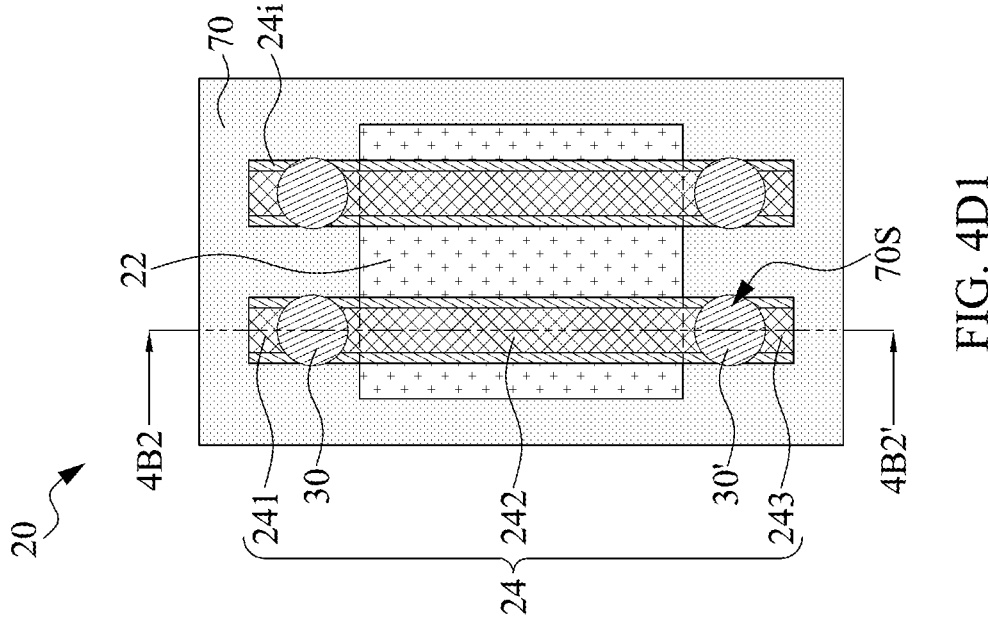
FIG. 4D1

101
10M
10
10S
10T
102

104

10C

103

101
10M
10
10S
10T
102

Z

Y X

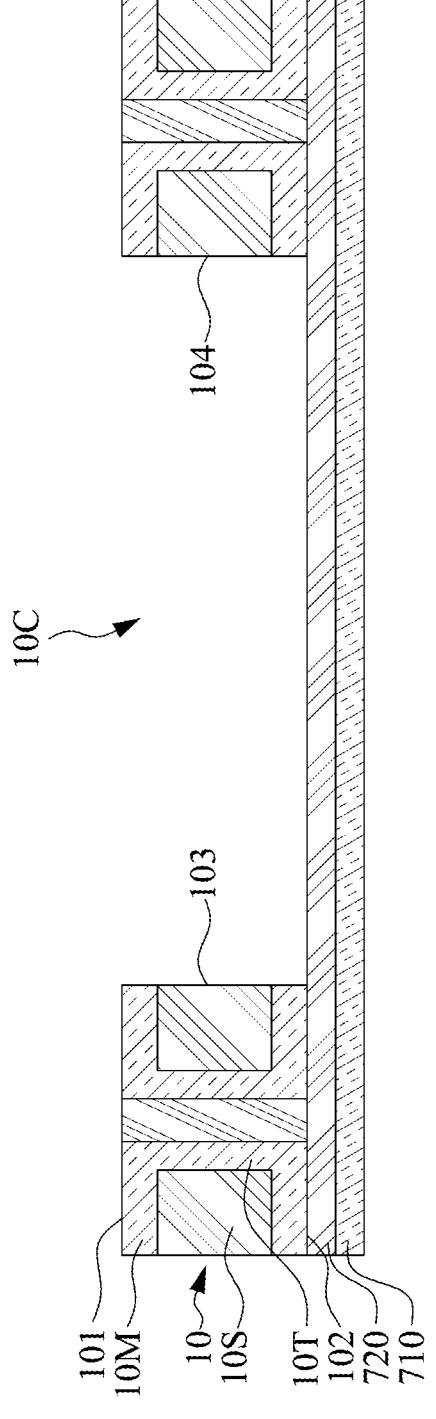
FIG. 4G
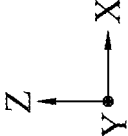

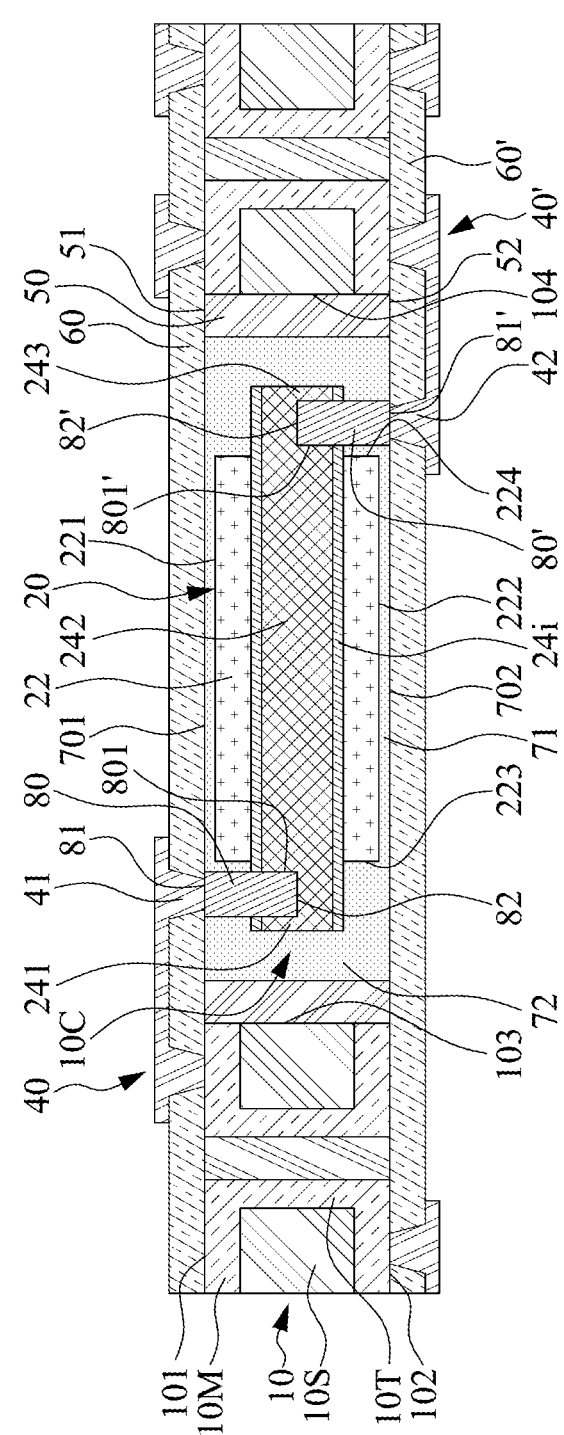
FIG. 5
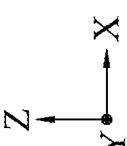

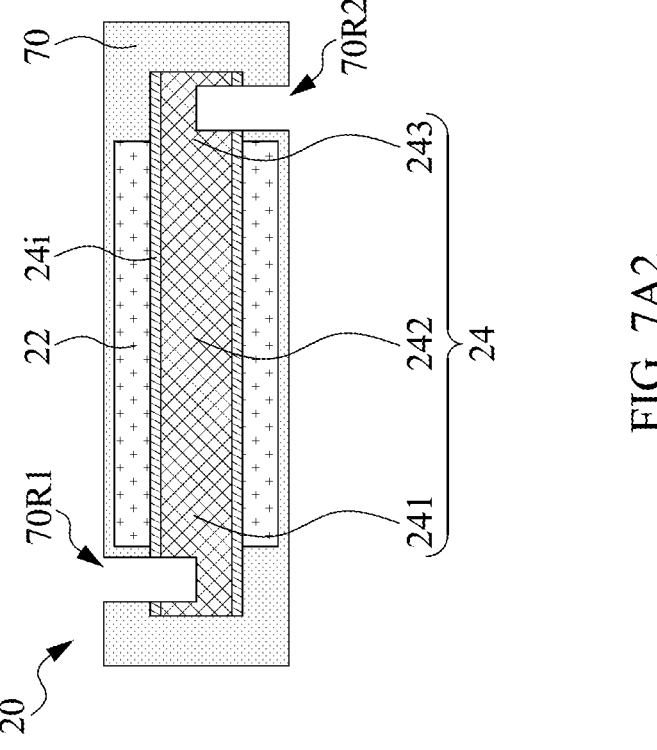
FIG. 7A2
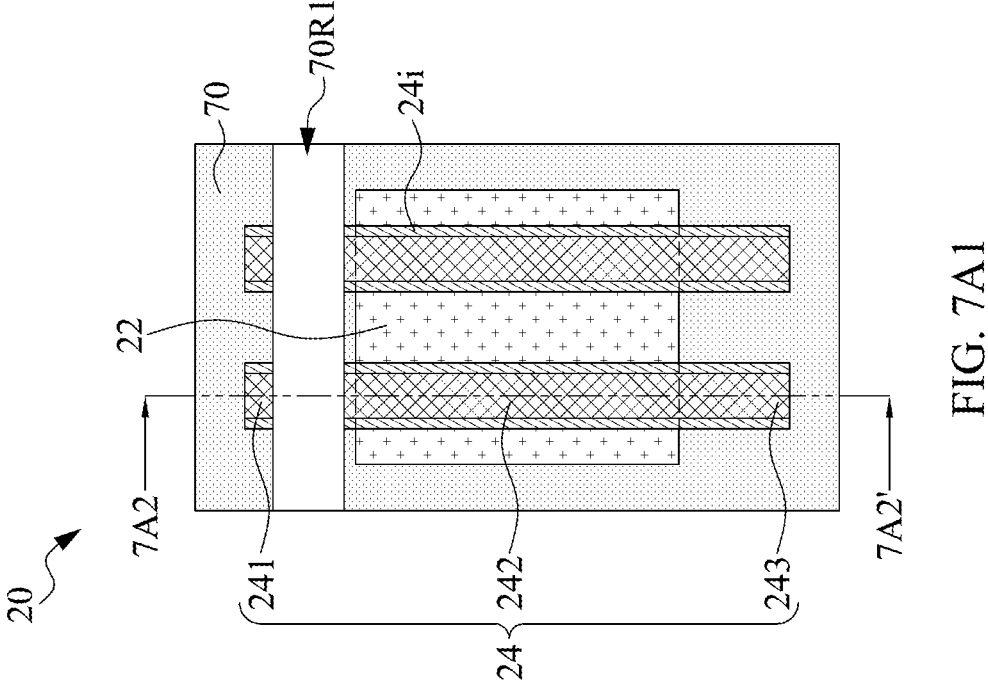
FIG. 7A1

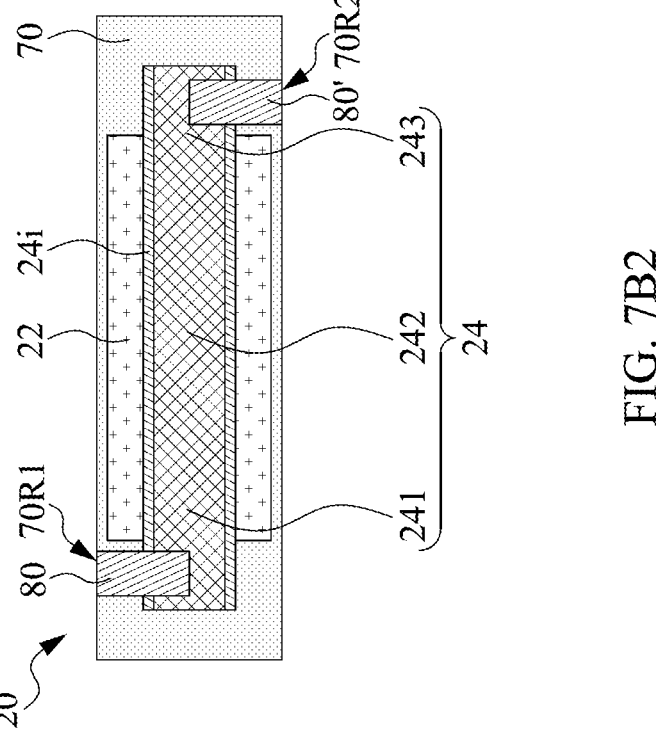
FIG. 7B2
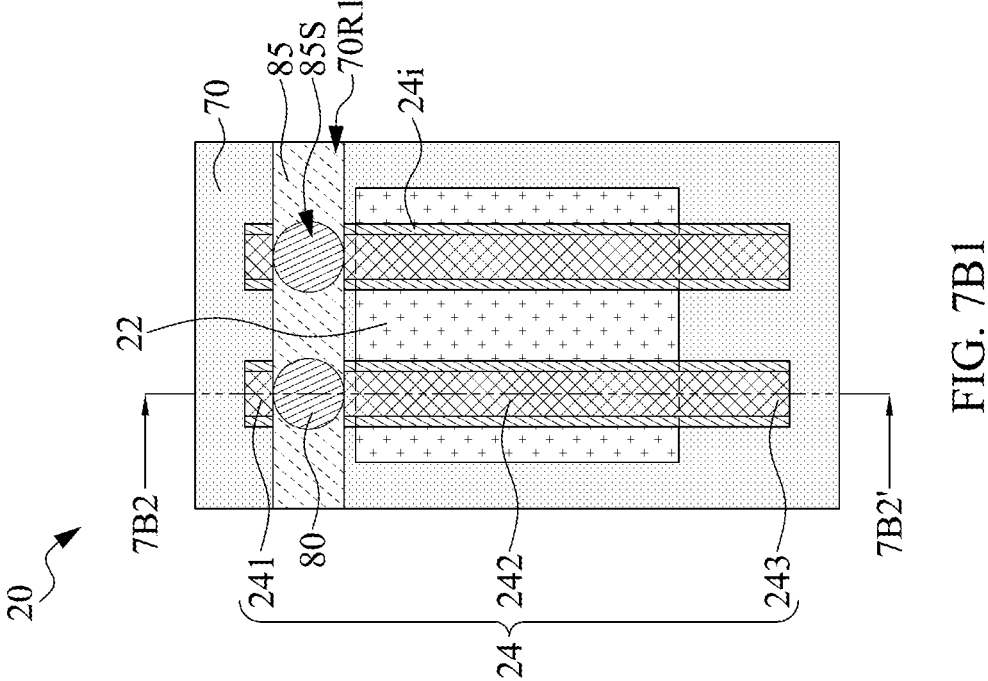
FIG. 7B1

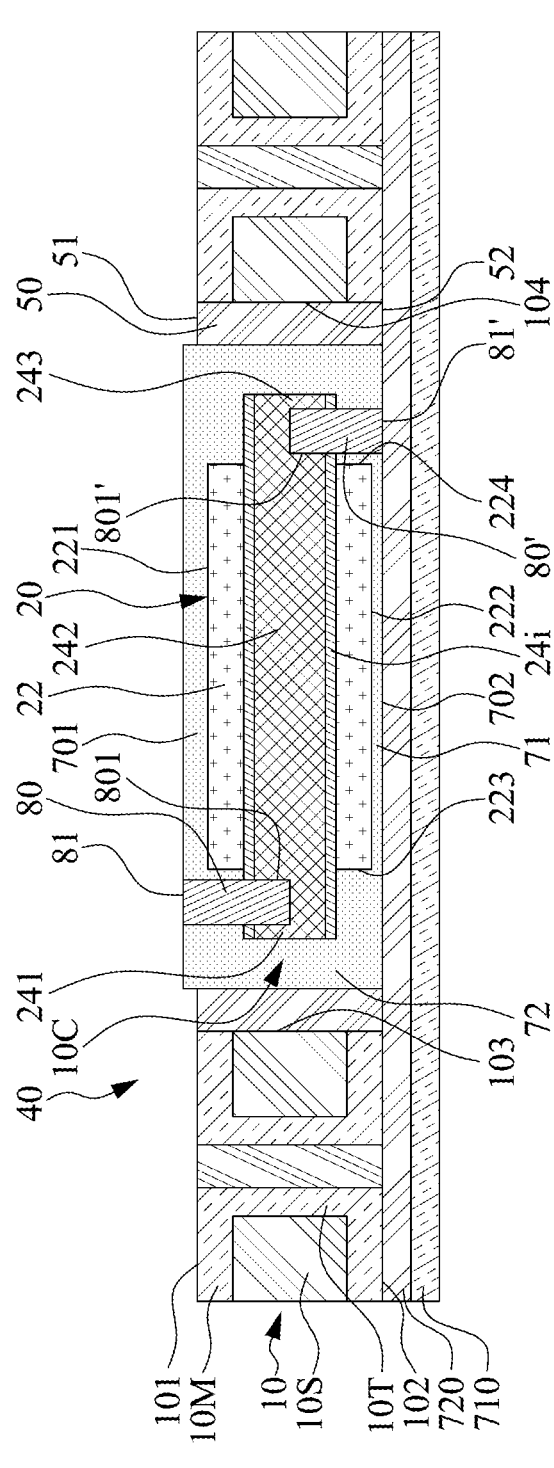
FIG. 7D
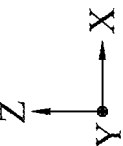

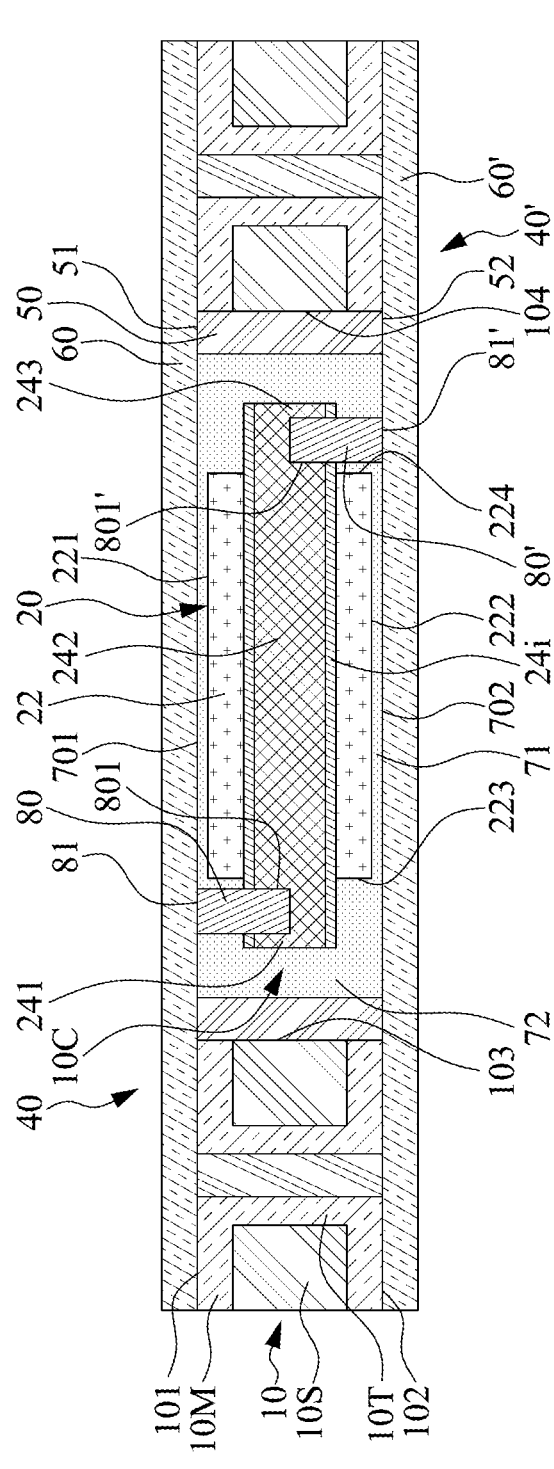
FIG. 7E
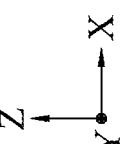

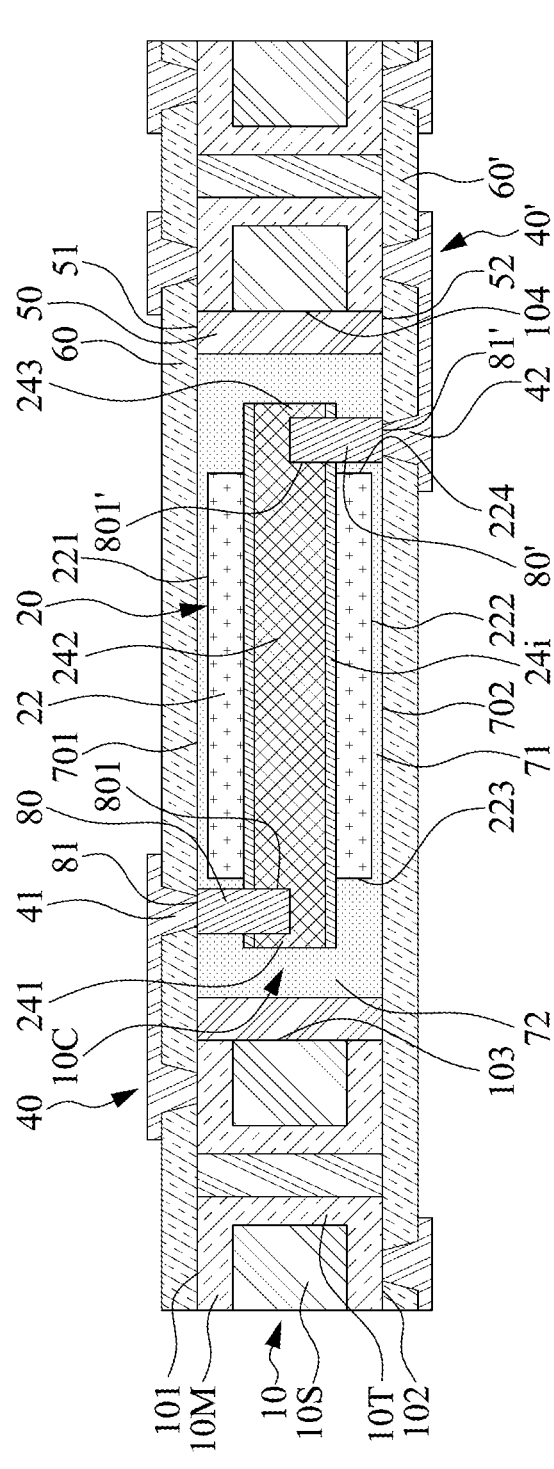
FIG. 7F
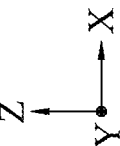

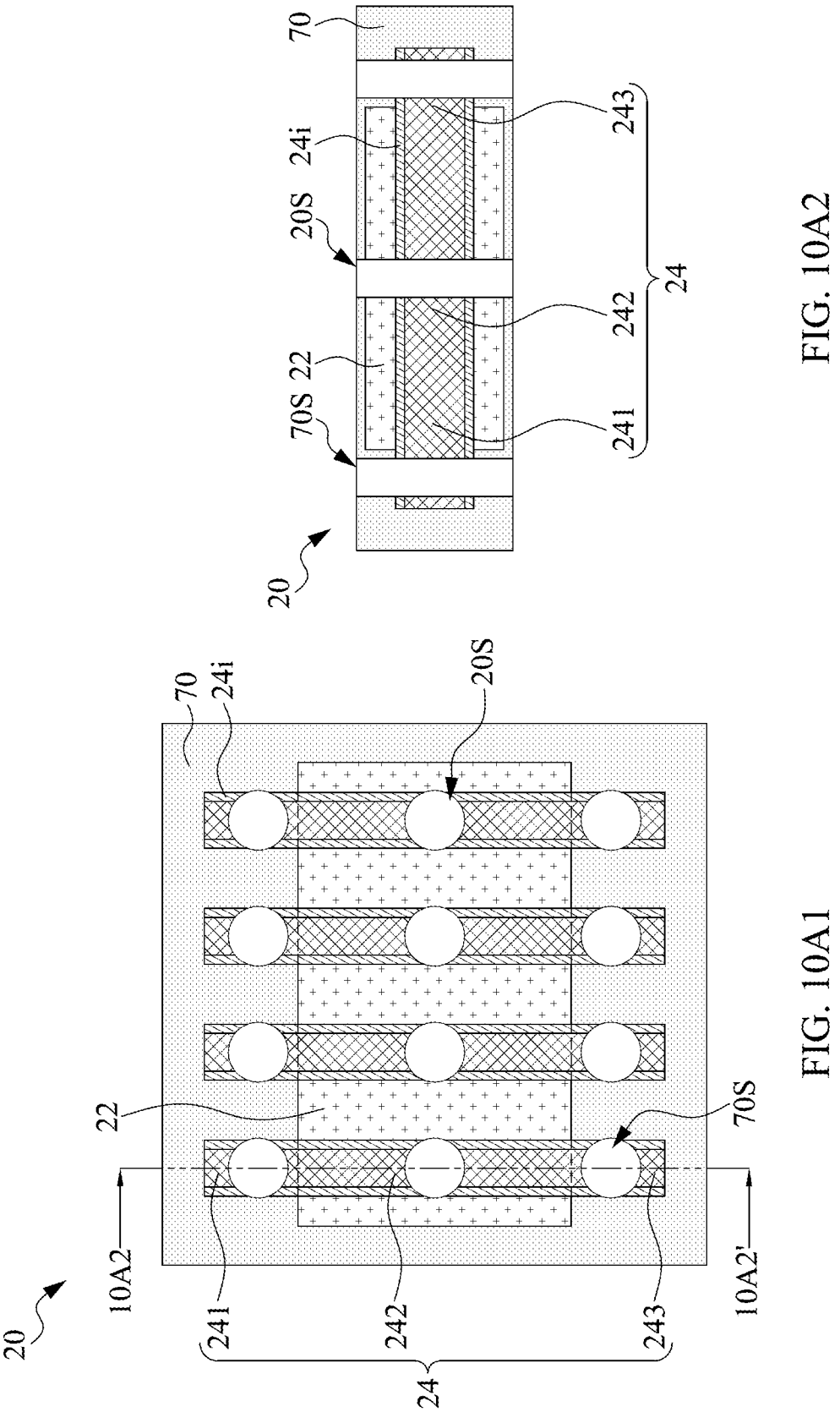
FIG. 10A2
FIG. 10A1

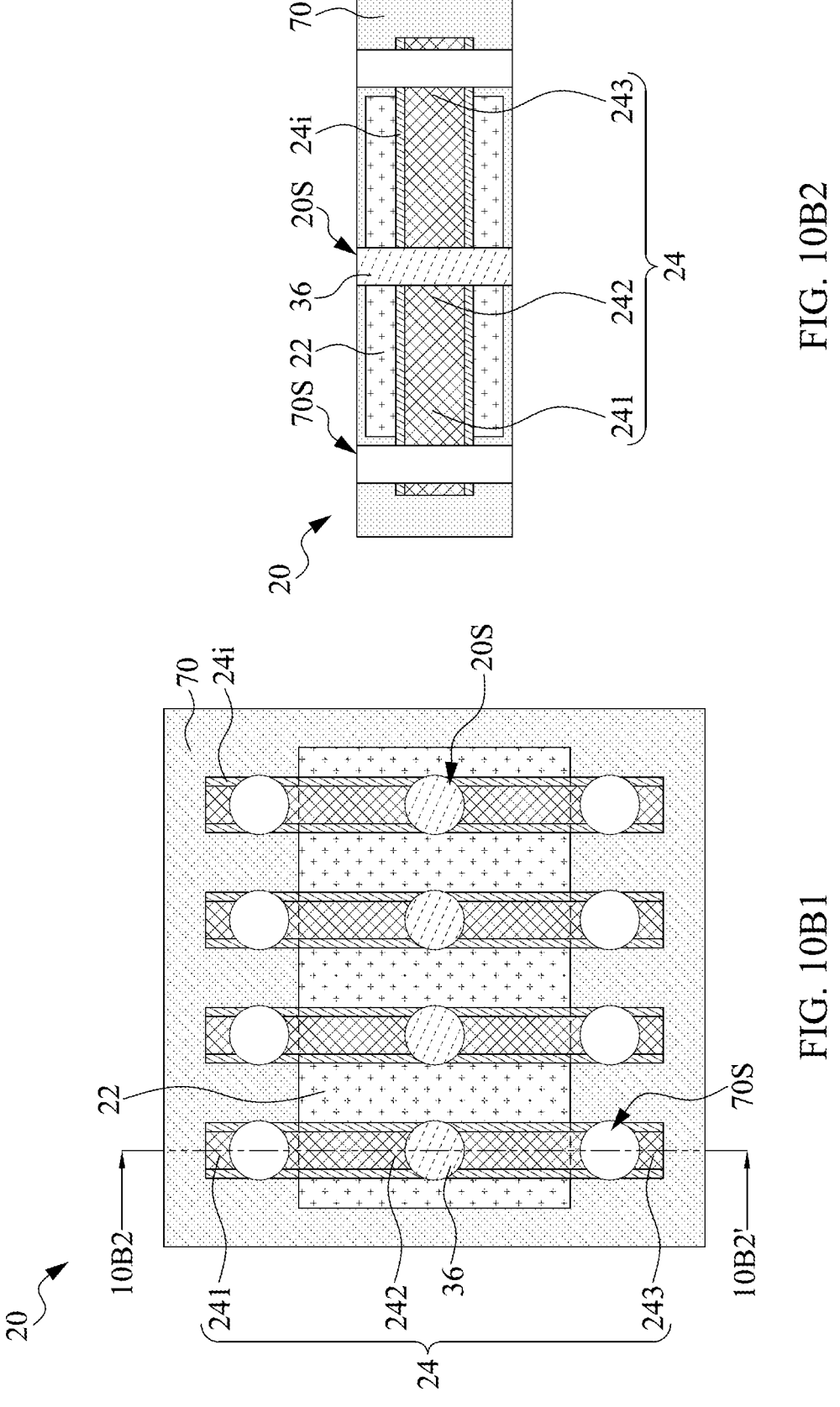
FIG. 10B2
FIG. 10B1

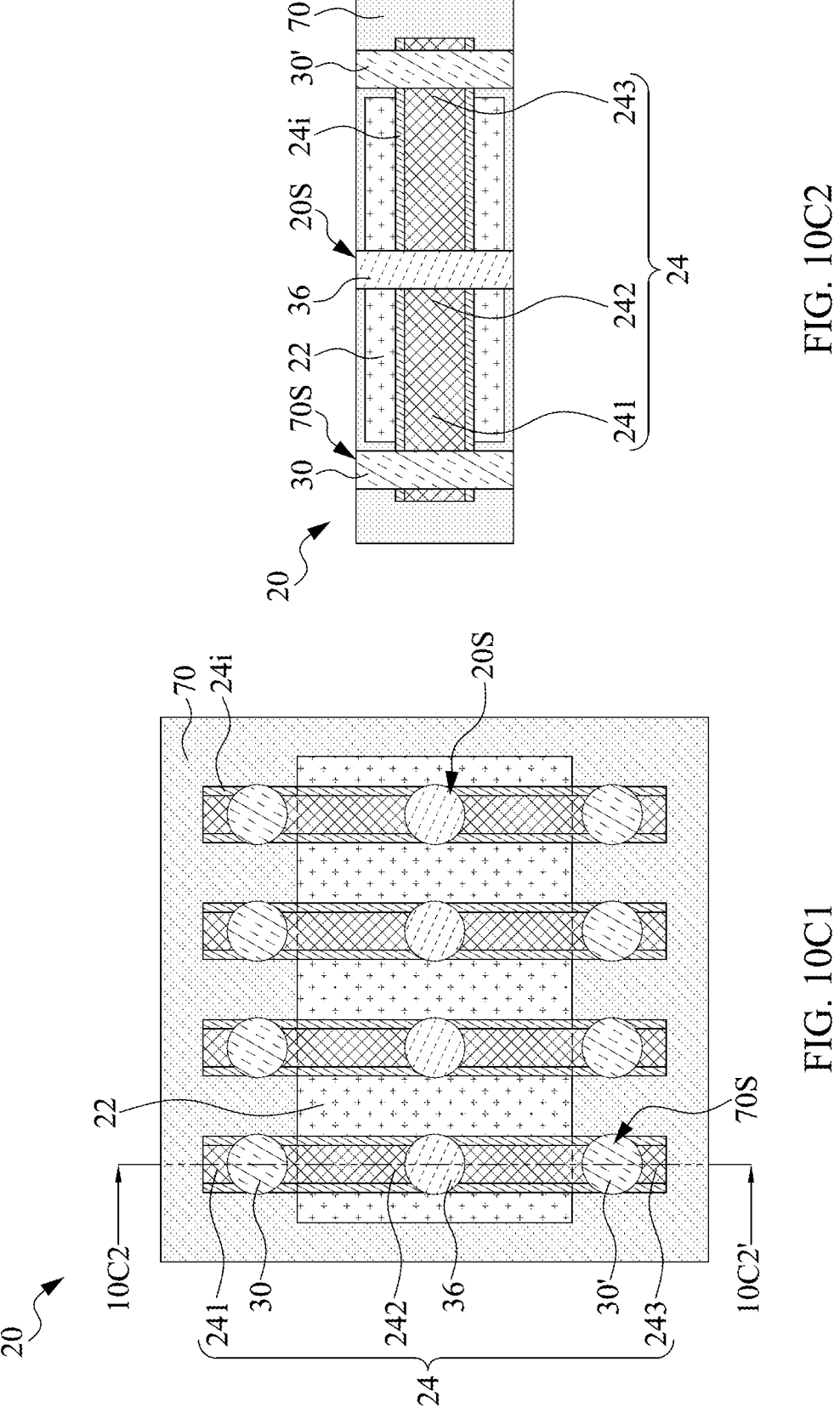
FIG. 10C2
FIG. 10C1

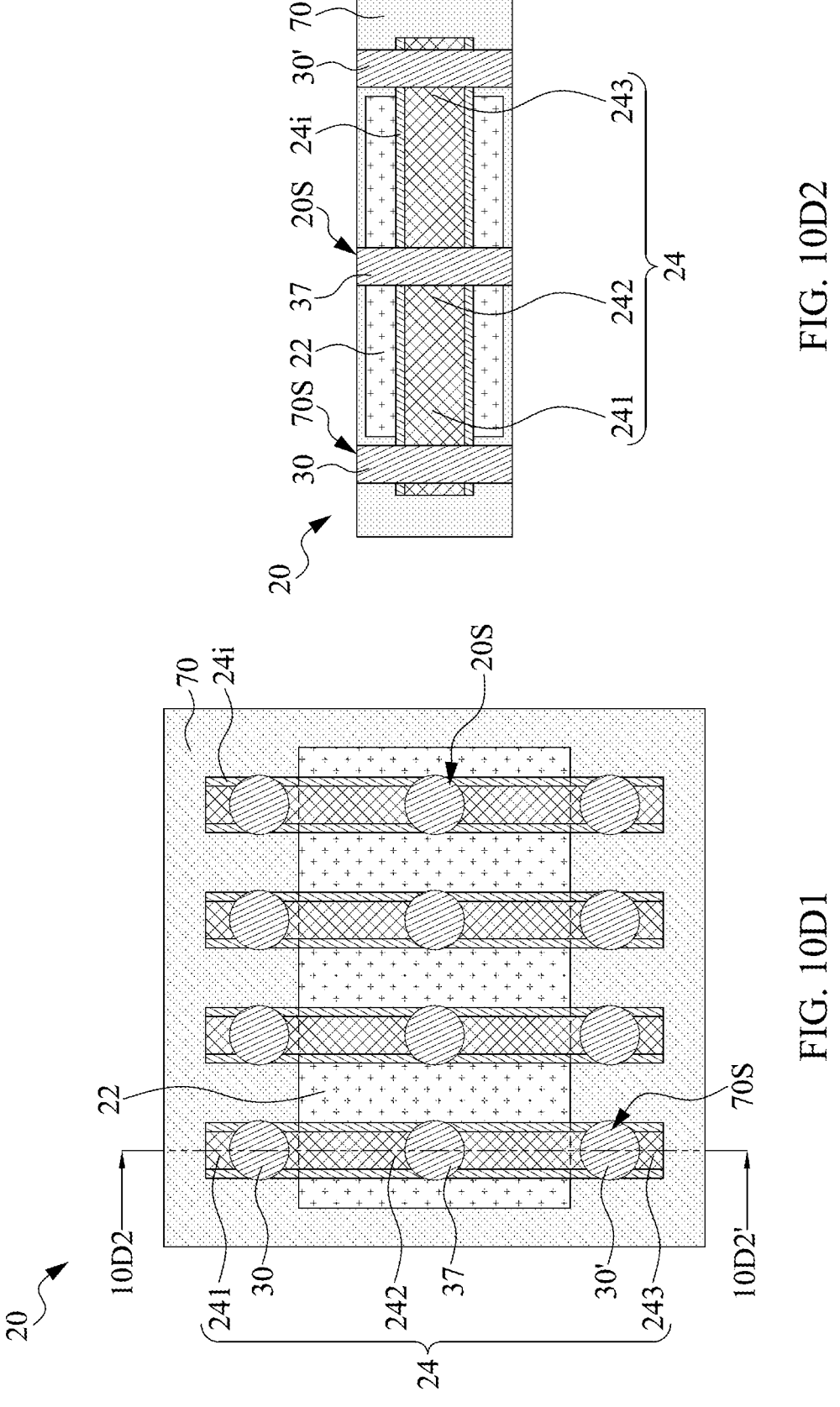
FIG. 10D2
FIG. 10D1

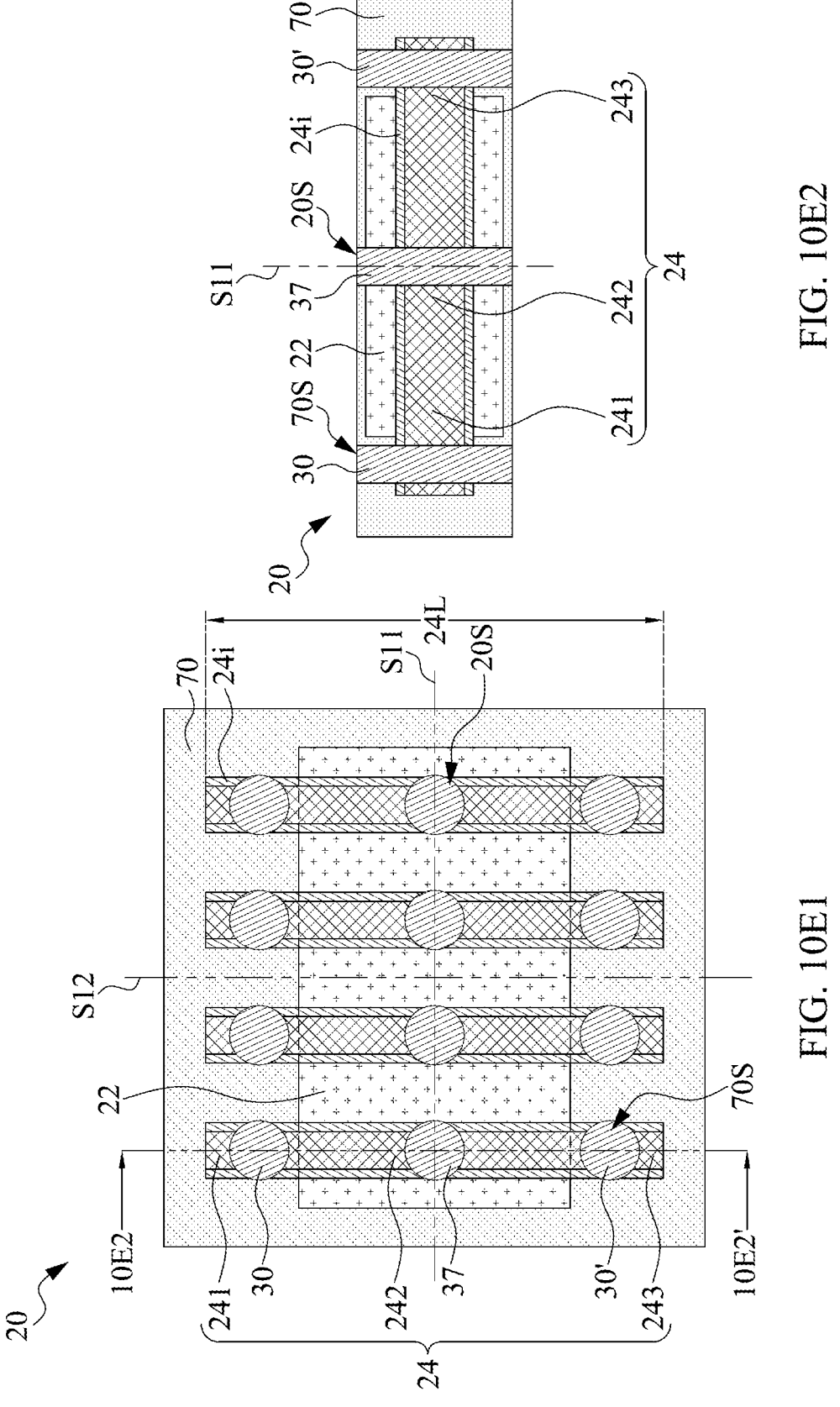
FIG. 10E2
FIG. 10E1

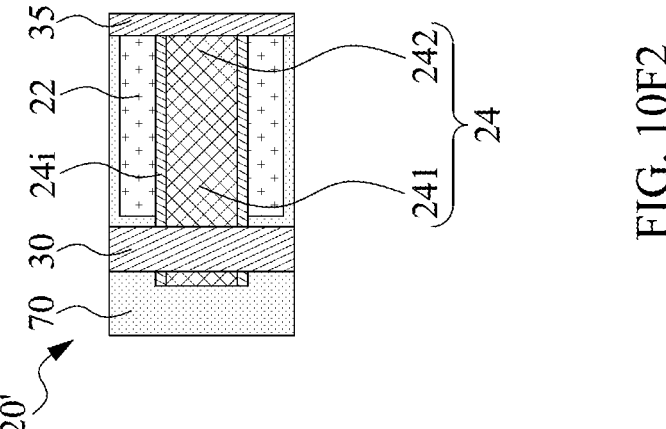
FIG. 10F2
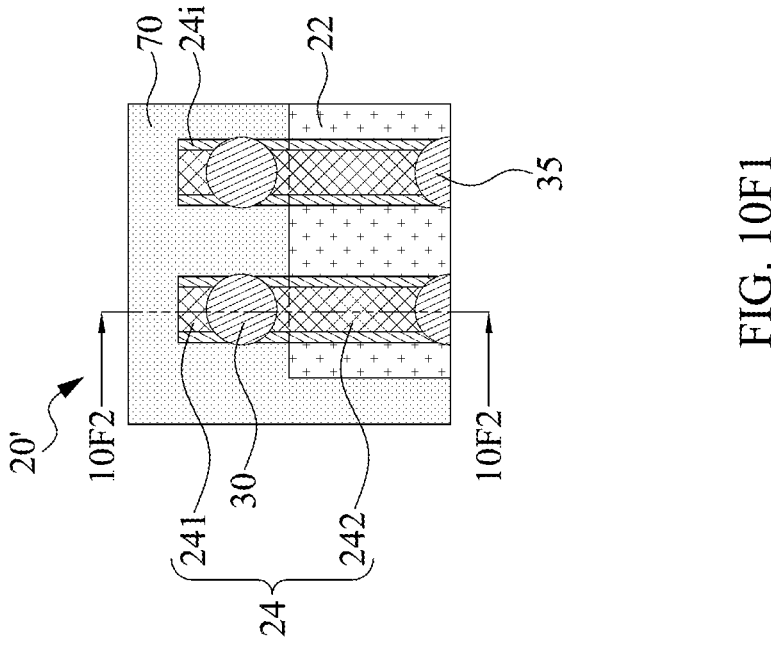
FIG. 10F1

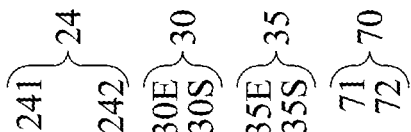
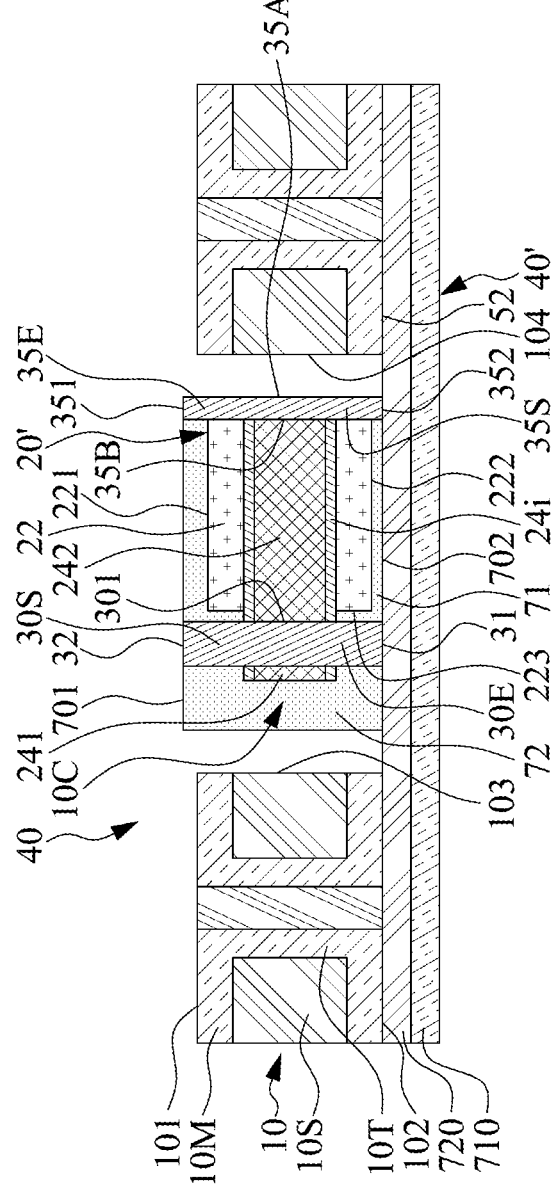
FIG. 10G
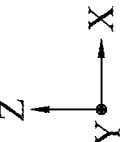

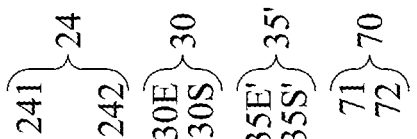
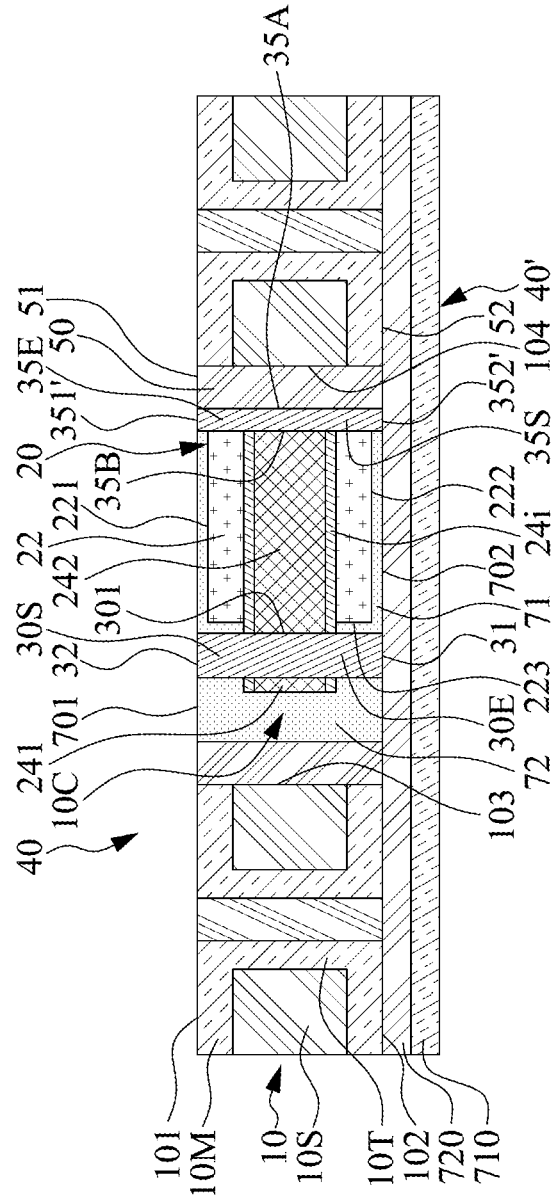
FIG. 10I
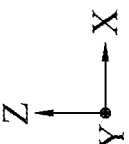

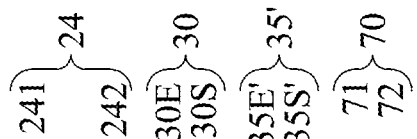
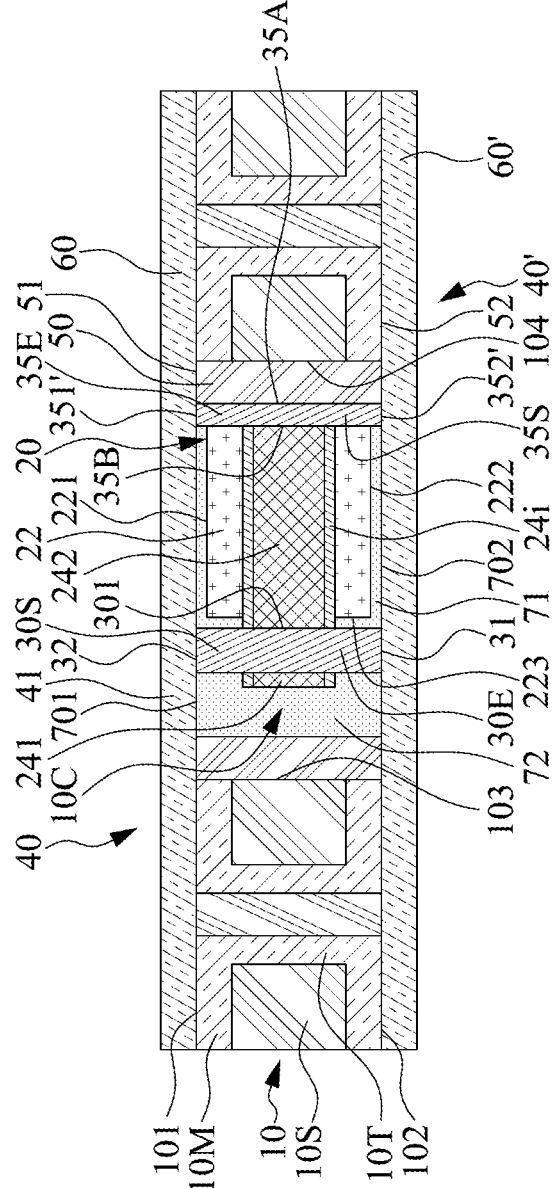
FIG. 10J
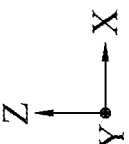

PACKAGE STRUCTURE AND METHOD OF MANUFACTURING THE SAME

BACKGROUND

1. Technical Field

The present disclosure relates generally to a package structure and a method of manufacturing the package structure.

2. Description of the Related Art

As multi-functionality and performance have become critical for consumer electronic and communication products such as smart phones, electronic device packages are required to possess superior electrical properties, low power consumption, and a large number of I/O ports. In order to achieve multi-functionality and improved performance, the packages are equipped with more components, both active and passive. Such components, however, tend to increase overall thickness of the package. It is therefore desirable to develop a package substrate with reduced thickness, multi-functionality, improved performance, and lower power consumption, while meeting the requirement for minimized profile for consumer electronic and communication devices.

SUMMARY

In one or more embodiments, a package structure includes an electronic component and a first connection element. The electronic component includes a conductive wire and a magnetic layer encapsulating the conductive wire. The first connection element is electrically connected to the conductive wire. The first connection element is disposed outside the magnetic layer.

In one or more embodiments, a package structure includes an electronic component and a first connection element. The electronic component includes a conductive wire extending in a first direction and a magnetic layer encapsulating the conductive wire. The first connection element extends in a second direction substantially perpendicular to the first direction and is in connection to the conductive wire, thereby forming a first contact interface between the conductive wire and the first connection element. The first contact interface is free from overlapping the magnetic layer in the second direction.

In one or more embodiments, a method of manufacturing a package structure, including: providing an electronic component, wherein the electronic component comprises a conductive wire and a magnetic layer encapsulating the conductive wire; forming a first dielectric layer to enclose the electronic component; and forming a first connection element penetrating the first dielectric layer and in contact with the conductive wire.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 4A1, FIG. 4A2, FIG. 4B1, FIG. 4B2, FIG. 4C1, FIG. 4C2, FIG. 4D1, FIG. 4D2, FIG. 4E, FIG. 4F, FIG. 4G, FIG. 4H, FIG. 4I, FIG. 4J, FIG. 4K, and FIG. 4L illustrate various operations in a method of manufacturing a package structure in accordance with some embodiments of the present disclosure;

FIG. 5 is a cross-section of a package structure in accordance with some embodiments of the present disclosure;

FIG. 7A1, FIG. 7A2, FIG. 7B1, FIG. 7B2, FIG. 7C, FIG. 7D, FIG. 7E, and FIG. 7F illustrate various operations in a method of manufacturing a package structure in accordance with some embodiments of the present disclosure;

FIG. 10A1, FIG. 10A2, FIG. 10B1, FIG. 10B2, FIG. 10C1, FIG. 10C2, FIG. 10D1, FIG. 10D2, FIG. 10E1, FIG. 10E2, FIG. 10F1, FIG. 10F2, FIG. 10G, FIG. 10H, FIG. 10I, FIG. 10J, and FIG. 10K illustrate various operations in a method of manufacturing a package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
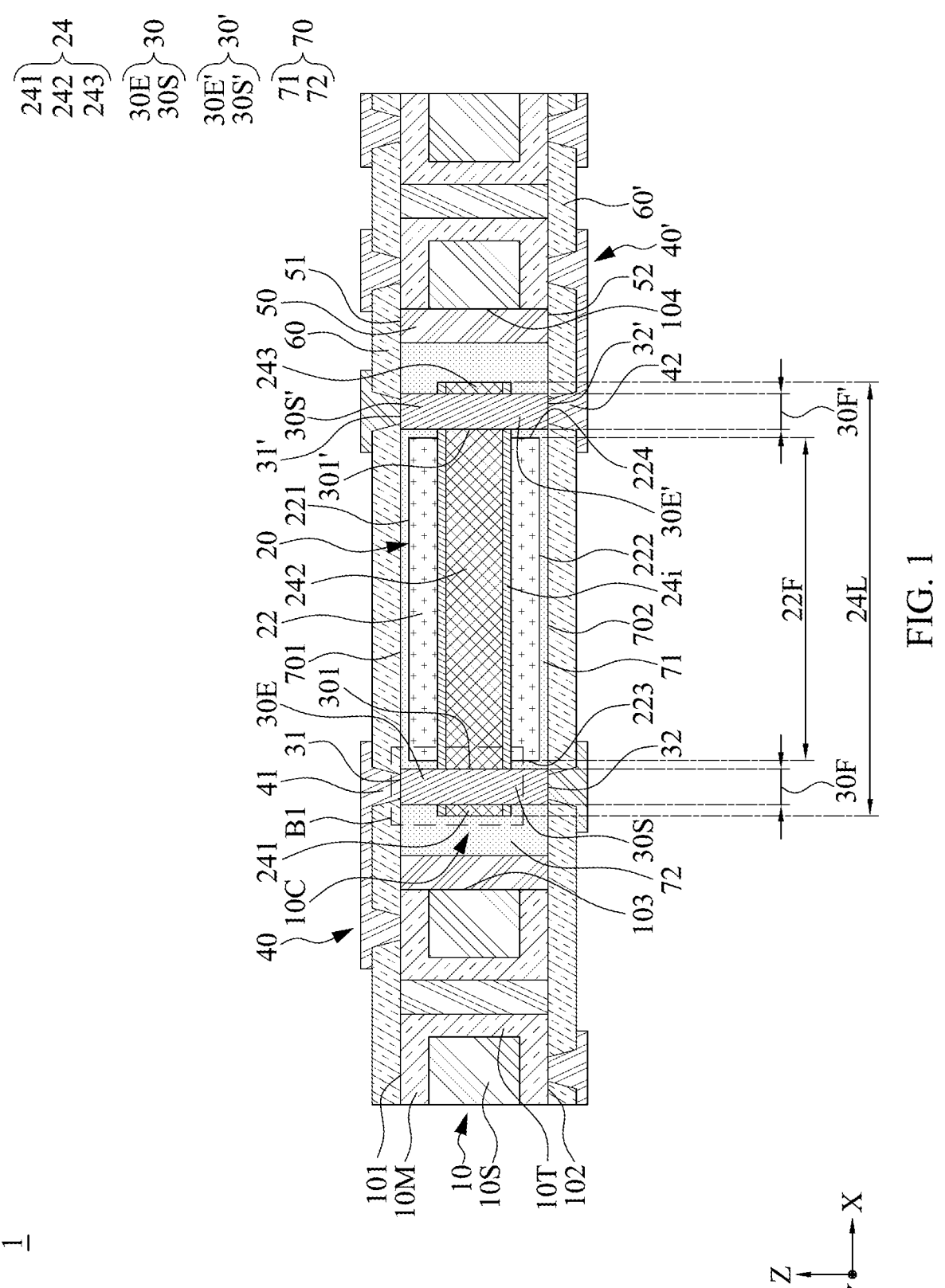
FIG. 1 is a cross-section of a package structure in accordance with some embodiments of the present disclosure.

FIG. 1 is a cross-section of a package structure 1 in accordance with some embodiments of the present disclosure. The package structure 1 includes a substrate 10, an electronic component 20, connection elements 30 and 30', conductive patterns 40 and 40', a dielectric layer 50, insulation layers 60, and a dielectric layer 70.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) including one or more conductive traces and one or more conductive through vias and/or a grounding element. In some embodiments, the substrate 10 includes a ceramic material or a metal plate. In some embodiments, the substrate 10 may include an organic substrate or a lead-frame. In some embodiments, the substrate 10 may include a two-layer substrate (e.g., a core substrate) which includes a core layer and a conductive material and/or structure disposed on an upper surface and a bottom surface of the core layer. The conductive material and/or structure may include a plurality of traces. In some embodiments, the substrate 10 may include a core-less substrate or other types of substrates. In some embodiments, the substrate 10 may include a package substrate with circuitry therein.

The substrate 10 may include a surface 101 and a surface 102 opposite to the surface 101. In some embodiments, the substrate 10 defines one or more cavities 10C. In some embodiments, the cavity 10C penetrates the substrate 10 between the surface 101 and the surface 102. In some embodiments, the substrate 10 includes a supporting portion 10S (or a core layer) defining the one or more cavities 10C for accommodating the electronic component 20. In some embodiments, the supporting portion 10S (or the core layer) may be made of or include a material that is relatively firm or having a relatively high hardness. By way of example, the material of the supporting portion 10S may include poly-propylene (PP), a resin material (e.g., epoxy-based resin), or other suitable dielectric or insulative materials. The sub-strate 10 may include a plurality of conductive structures 10T such as conductive vias extending from the surface 101 to the surface 102 of the substrate 10 to electrically connect electronic components and/or conductive features disposed on the surface 101 and the surface 102. For example, the conductive structure 10T may include copper or other suit-able conductive materials. In some embodiments, the con-ductive structure 10T includes a multi-layered structure including a conductive liner and an insulative material filled within or surrounded by the conductive liner. The conduc-tive liner may include copper. The substrate 10 may further include conductive layers 10M on an upper surface and a bottom surface of the supporting portion 10S (or the core layer). In some embodiments, the conductive layer 10M is electrically connected to the conductive structure 10T.

The electronic component 20 may be disposed in the substrate 10. In some embodiments, the electronic compo-nent 20 is disposed within the cavity 10C of the substrate 10. The thickness of the electronic component 20 may be less than or equal to that of the substrate 10 such that the installation of the electronic component 20 does not increase the overall thickness of the package substrate 1. The elec-tronic component 20 may include a passive component such as an inductor. In some embodiments, the electronic com-ponent 20 includes a magnetic layer 22 (also referred to as "a magnetic body") and one or more conductive wires 24. In some embodiments, the magnetic layer 22 encapsulates the conductive wire 24. In some embodiments, the conductive wire 24 is embedded in the magnetic layer 22. The electronic component 20 may include an insulation layer 24i disposed between the conductive wire 24 and the magnetic layer 22. The material of the insulation layer 24i may include carbon.

In some embodiments, the electronic component 20 has a structure which is substantially symmetrical with a horizon-tal plane (e.g., a horizontal plane substantially parallel to the surface 101 of the substrate 10). For example, the structure including the magnetic layer 22 and the conductive wire 24 as a whole can be substantially symmetrical with a horizon-tal plane.

In some embodiments, the magnetic layer 22 has a surface 221 and a surface 222 opposite to the surface 221. The magnetic layer 22 has a surface 223 and a surface 224 opposite to the surface 221, both disposed along a length-wise direction 24L of the conductive wire 24. The length-wise direction 24L may be parallel to the surface 102 of the substrate 10. The surfaces 223 and 224 may extend between the surfaces 221 and 222.

In some embodiments, the magnetic layer 22 is electri-cally insulative. In some embodiments, the electronic com-ponent 20 is an inductor, and the magnetic layer 22 being electrically insulative can prevent malfunction of the induc-tor. In some embodiments, the magnetic layer 22 may include ferrite or other suitable insulative magnetic materi-als. For example, the material of the magnetic layer 22 may include a compound of iron oxide and other components including one of magnesium (Mg), aluminum (Al), barium (Ba), manganese (Mn), copper (Cu), nickel (Ni), cobalt (Co) or the like. The magnetic layer 22 may be composed of material with permeability in a range from about 10 Hm$^{-1}$ to about 10,000 Hm$^{-1}$.

In some embodiments, the conductive wire 24 includes a plurality of portions (e.g., portions 241, 242, and 243). The portion 241 may be exposed by the surface 223 of the magnetic layer 22. In some embodiments, the portion 241 may protrude from the surface 223 of the magnetic layer 22. The portion 243 may be exposed by the surface 224 of the magnetic layer 22. The portion 242 may be surrounded by the magnetic layer 22. In some embodiments, the portion 243 may protrude from the surface 224 of the magnetic layer 22. In some embodiments, the conductive wire 24 may include a metal wire such as a copper wire. In some embodiments, the protruded portions 241 and 243 may not be surrounded by the insulation layer 24i.

The dielectric layer 70 may be disposed in the substrate 10. The dielectric layer 70 may be disposed within the cavity 10C. The dielectric layer 70 may enclose or surround the electronic component 20. The dielectric layer 70 may cover the surfaces 221, 222, 223, 224 of the magnetic layer 22. The dielectric layer 70 may enclose the portions 241 and 243 of the conductive wire 24. The dielectric layer 70 may cover the portions 241 and 243 of the conductive wire 24.

The dielectric layer 70 may have a portion 71 covering the magnetic layer 22 (or the surfaces 221, 222, 223, and/or 224) and a portion 72 connected to the portion 71 and covering the portions 241 and 243 of the conductive wire 24. The portion 71 of the dielectric layer 70 may be disposed between the magnetic layer 22 and the insulation layer 60. The dielectric layer 70 may have a surface 701 higher than the surface (or the upper surface) 221 of the magnetic layer 22 and a surface 702 lower than the surface (the lower surface) 222 of the magnetic layer 22. The surface 701 may be opposite to the surface 702. The surface 701 of the dielectric layer may be substantially parallel to the surface 221 of the magnetic layer 22. The surface 702 of the dielectric layer may be substantially parallel to the surface 222 of the magnetic layer 22.

In some embodiments, the dielectric layer 70 may include an epoxy resin including fillers, a molding compound (e.g., an epoxy molding compound or other molding compound), polyimide, a phenolic compound or material, a material including silicone dispersed therein, or a combination thereof. The dielectric layer 70 may include an optically clear encapsulant. In some embodiments, the dielectric layer 70 may be transparent. In some embodiments, the dielectric layer 70 may have a transmittance tailored to specific wavelengths. The dielectric layer 70 may allow light with a specific wavelength to pass therethrough. The dielectric layer 70 may have an infrared (IR) cut resin to filter the IR. The dielectric layer 70 may have a visible light cut resin to filter the visible light.

The connection element 30 may penetrate the dielectric layer 70. The connection element 30 may extend through the dielectric layer 70. The connection element 30 may be embedded in the dielectric layer 70. The connection element 30 may be enclosed (or surrounded) by the dielectric layer 70. The connection element 30 may extend along an axis (e.g., Z-axis) or the direction of the Z-axis substantially perpendicular to another axis (e.g., X-axis) or the direction of the X-axis along which the electronic component 20 (or the conductive wire 24) extends. The connection element 30 may extend along the surface 223 of the magnetic layer 22 and be disposed outside of the magnetic layer 22. The surface 223 may be between the surface 224 and the connection element 30 in the cross-section view as shown in FIG. 1. The connection element 30 may penetrate the portion 241 of the conductive wire 24. The connection element 30 may connect to the conductive wire 24, thereby forming a contact interface 301 between the conductive wire 24 and the connection element 30. The connection element 30 may have a lateral surface 301 (same reference as the contact interface 301 for brevity) covered by the conductive wire 24. In some embodiments, the conductive wire 24 is electrically connected by the connection element 30. In some embodiments, the portion 241 of the conductive wire 24 may be electrically connected by the connection element 30.

In some embodiments, the connection element 30 may be separated from the magnetic layer 22. A vertical footprint 30F of the connection element 30 may be free from overlapping a vertical footprint 22F of the magnetic layer 22. As shown in FIG. 1, the vertical footprint 30F may be a projecting area of the connection element 30 on the surface 102 of the substrate 10. The vertical footprint 22F may be a projecting area of the on the surface 102 of the substrate 10. In some embodiments, the contact interface 301 may be free from vertically overlapping the magnetic layer 22. In some embodiments, the contact interface 301 may be free from overlapping the magnetic layer 22 in the Z-axis (or the Z direction).

In some embodiments, a modulus of the conductive wire 24 is greater than or exceeds a modulus of the connection element 30. The modulus of the connection element 30 may be larger than 130 GPa. In some embodiments, the modulus of the connection element 30 substantially equals a modulus of the magnetic layer 22.

In some embodiments, a CTE of the connection element 30 substantially equals a CTE of the magnetic layer 22. The CTE of the conductive wire 24 may be $1.65 \times 10^{-5\circ}$ C.$^{-1}$. The CTE of the magnetic layer 22 may be $1.5 \times 10^{-5\circ}$ C.$^{-1}$. The CTE of the connection element 30 may be $1.65 \times 10^{-5\circ}$ C.$^{-1}$.

In some embodiments, the connection element 30 includes an electroplated conductive layer. In some embodiments, the connection element 30 includes solder. In some embodiments, the connection element 30 includes conductive gel or conductive paste. In some embodiments, the connection element 30 includes a resin layer and conductive material dispersed therein. The conductive wire 24 and the connection element 30 may be composed of different materials. A grain size of the material of the connection element 30 made by electroplating may be different from a grain size of the material of the conductive wire 24 extruded from e.g., ingot. For example, the grain size of the material of the conductive wire 24 may be greater than that of the connection element 30.

In some embodiments, the connection element 30 has a surface 31 and a surface 32 opposite to the surface 31. The surface 31 of the connection element 30 and the surface 701 of the dielectric layer 70 may be substantially coplanar. The surface 31 of the connection element 30 may be exposed by the surface 701 of the dielectric layer 70. The surface 32 of the connection element 30 and the surface 702 of the dielectric layer 70 may be substantially coplanar. The surface 32 of the connection element 30 may be exposed by the surface 702 of the dielectric layer 70.

In some embodiments, the connection element 30 includes an electrical connection portion 30E and a support portion 30S may be configured to be in the equal potential when applied with a bias. In some embodiments, the electrical connection portion 30E and the support portion 30S are equipotential. In some embodiments, the electrical connection portion 30E directly contacts or connects to the support portion 30S. In some embodiments, the electrical connection portion 30E and the support portion 30S of the connection element 30 are integrally formed. In some embodiments, the electrical connection portion 30E and the support portion 30S of the connection element 30 are free of an interface therebetween. In some embodiments, the electrical connection portion 30E is configured to electrically connect to the conductive wire 24 and the substrate 10, and the support portion 30S is configured to support the electrical connection portion 30E. In some embodiments, the exposed surface of the electrical connection portion 30E (e.g., the surface 31 of the connection element 30) may electrically connect to the substrate 10 through the conductive pattern 40. In some embodiments, the exposed surface of the support portion 30S (e.g., the surface 32 of the connection element 30) may be in contact with a dummy structure of the conductive pattern 40'. The dummy structure may have no electrical functionality and may be used to improve the process uniformity. In some embodiments, the electrical connection portion 30E and the support portion 30S are located on opposite sides of the conductive wire 24 in cross-section. In an alternative embodiment, the exposed surface of the support portion 30S (e.g., the surface 32 of the connection element 30) is free from contacting a conductive feature (e.g., a conductive layer, a conductive pattern, or the like). According to some embodiments of the present disclosure, with the design of the electrical connection portion 30E and the support portion 30S, warpage can be effectively reduced. In other words, the electrical connection portion 30E and the support portion 30S are collectively configured to mitigate warpage of the package structure 1.

The connection element 30' may penetrate the dielectric layer 70. The connection element 30' may be embedded in the dielectric layer 70. The connection element 30' may be enclosed (or surrounded) by the dielectric layer 70. The connection element 30' may extend along an axis (e.g., Z-axis) or the direction of the Z-axis substantially perpendicular to another axis (e.g., X-axis) or the direction of the X-axis along which the electronic component 20 (or the conductive wire 24) extends. The connection element 30' may extend along the surface 224 of the magnetic layer 22 and be disposed exterior to the magnetic layer 22. The connection element 30' may penetrate the portion 243 of the conductive wire 24. The connection element 30' may connect to the conductive wire 24, thereby forming a contact interface 301' between the conductive wire 24 and the connection element 30'. The connection element 30' may have a lateral surface 301' (same reference as the contact interface for brevity) covered by the conductive wire 24. In some embodiments, the conductive wire 24 is electrically connected by the connection element 30'. In some embodiments, the portion 243 of the conductive wire 24 may be electrically connected by the connection element 30'.

In some embodiments, the connection element 30' may be separated from the magnetic layer 22. A vertical footprint 30F' of the connection element 30' may be free from overlapping a vertical footprint 22F of the magnetic layer 22. As shown in FIG. 1, the vertical footprint 30F' may be a projecting area of the connection element 30' on the surface 102 of the substrate 10. The vertical footprint 22F may be a projecting area of the on the surface 102 of the substrate 10. In some embodiments, the contact interface 301' may be free from vertically overlapping the magnetic layer 22.

In some embodiments, a modulus of the conductive wire 24 is greater than or exceeds a modulus of the connection element 30'. The modulus of the connection element 30' may be larger than 130 GPa In some embodiments, the modulus of the connection element 30' substantially equals a modulus of the magnetic layer 22.

In some embodiments, a CTE of the connection element 30' substantially equals a CTE of the magnetic layer 22. The CTE of the connection element 30' may be $1.65 \times 10^{-5 \circ}$ C.$^{-1}$.

In some embodiments, the connection element 30' includes an electro-plating conductive layer. In some embodiments, the connection element 30' includes solder. In some embodiments, the connection element 30' includes conductive gel or paste. In some embodiments, the connection element 30' includes a resin layer and a conductive material dispersed in the resin layer. The conductive wire 24 and the connection element 30' may be composed of different materials. A grain size of the material of the connection element 30' made by electroplating may be different from a grain size of the material of the conductive wire 24 extruded from e.g., ingot. For example, the grain size of the material of the conductive wire 24 may be greater than that of the connection element 30'.

In some embodiments, the connection element 30' has a surface 31' and a surface 32' opposite to the surface 31'. The surface 31' of the connection element 30' and the surface 701 of the dielectric layer 70 may be substantially coplanar. The surface 31' of the connection element 30' may be exposed by the surface 701 of the dielectric layer 70. The surface 32' of the connection element 30' and the surface 702 of the dielectric layer 70 may be substantially coplanar. The surface 32' of the connection element 30' may be exposed by the surface 702 of the dielectric layer 70.

In some embodiments, the connection element 30' includes an electrical connection portion 30E' and a support portion 30S' may be configured to be in the equal potential when applied with a bias. In some embodiments, the electrical connection portion 30E' and the support portion 30S' are equipotential. In some embodiments, the electrical connection portion 30E' directly contacts or connects to the support portion 30S'. In some embodiments, the electrical connection portion 30E' and the support portion 30S' of the connection element 30' are integrally formed. In some embodiments, the electrical connection portion 30E' and the support portion 30S' of the connection element 30' are free of an interface therebetween. In some embodiments, the electrical connection portion 30E' is configured to electrically connect to the conductive wire 24 and the substrate 10, and the support portion 30S' is configured to support the electrical connection portion 30E'. In some embodiments, the exposed surface of the electrical connection portion 30E' (e.g., the surface 32' of the connection element 30') may electrically connect to the substrate 10 through the conductive pattern 40'. In some embodiments, the exposed surface of the support portion 30S' (e.g., the surface 31' of the connection element 30') may be in contact with a dummy structure of the conductive pattern 40. In some embodiments, the electrical connection portion 30E' and the support portion 30S' are located on opposite sides of the conductive wire 24 in cross-section. In an alternative embodiment, the exposed surface of the support portion 30S' (e.g., the surface 31' of the connection element 30') is free from contacting a conductive feature (e.g., a conductive layer, a conductive pattern, or the like). According to some embodiments of the present disclosure, with the design of the electrical connection portion 30E' and the support portion 30S', warpage can be effectively reduced. In other words, the electrical connection portion 30E' and the support portion 30S' are collectively configured to mitigate warpage of the package structure 1.

The conductive pattern 40 may be on the surface 101 of the substrate 10, and the conductive pattern 40' may be on the surface 102 of the substrate 10. In some embodiments, the conductive pattern 40 is electrically connected to the connection element 30, and the conductive pattern 40' is electrically connected to the connection element 30'. In some embodiments, the conductive pattern 40 includes a conductive via 41, and the conductive pattern 40' includes a conductive via 42.

In some embodiments, the conductive via 41 is electrically connected to the connection element 30, and a contact interface (e.g., the surface 31 of the connection element 30) between the conductive via 41 and the connection element 30 substantially aligns with the surface 701 of the dielectric layer 70. In some embodiments, the contact interface 31 may be higher than the surface (or the upper surface) 221 of the electronic component 20. In some embodiments, the conductive via 41 electrically connects the substrate 10 to the connection element 30 through the conductive layer 10M. In some embodiments, the contact interface 31 between the conductive via 41 and the connection element 30 is exposed by the surface 701 of the dielectric layer 70, and the connection element 30 further has an end surface (e.g., the surface 32 of the connection element 30) exposed by the surface 702 of the dielectric layer 70. The end surface 32 may connect to a dummy structure of the conductive pattern 40'. The conductive via 41 in contact with the connection element 30 may be free from vertically overlapping the magnetic layer 22.

In some embodiments, the conductive via 42 is electrically connected to the connection element 30', and a contact interface (e.g., the surface 32' of the connection element 30') between the conductive via 42 and the connection element 30' substantially aligns with the surface 702 of the dielectric layer 70. In some embodiments, the contact interface 32' may be lower than the surface (or the upper surface) 222 of the electronic component 20. In some embodiments, the conductive via 42 electrically connects the substrate 10 to the connection element 30' through the conductive layer 10M. In some embodiments, the contact interface surface 32' between the conductive via 42 and the connection element 30' is exposed by the surface 702 of the dielectric layer 70, and the connection element 30' further has an end surface (e.g., the surface 31' of the connection element 30') exposed by the surface 701 of the dielectric layer 70. The end surface 31' may connect to a dummy structure of the conductive pattern 40'. The conductive via 42 in contact with the connection element 30' may be free from vertically over-lapping the magnetic layer 22.

The dielectric layer 50 may be disposed in the cavity 10C of the substrate 10. The substrate 10 may have a side surface 103 facing the electronic component 20. The dielectric layer 50 may be disposed between the side surface 103 of the substrate 10 and the magnetic layer 22 of the electronic component 20. The dielectric layer 50 may surround the dielectric layer 70. The dielectric layer 50 may be disposed between the side surface 103 of the substrate 10 and the dielectric layer 70. The dielectric layer 50 and the dielectric layer 70 may be disposed between the side surface 103 of the substrate 10 and the magnetic layer 22. The dielectric layer 70 may be separated from the side surface 103 of the substrate 10 by the dielectric layer 50. In some embodiments, the dielectric layer 50 is spaced apart from the connection element 30. In some embodiments, the dielectric layer 50 is spaced apart from the connection element 30'.

In some embodiments, a surface 51 (also referred to as "an upper surface") of the dielectric layer 50 substantially aligns with the contact interface (e.g., the surface 31 of the connection element 30) between the conductive via 41 and the connection element 30. In some embodiments, the surface 51 may substantially align with the surface 701. In some embodiments, a surface 52 (also referred to as "a lower surface") of the dielectric layer 50 substantially aligns with the contact interface (e.g., the surface 32 of the connection element 30') between the conductive via 42 and the connection element 30'. In some embodiments, the surface 52 may substantially align with the surface 702. In some embodiments, the dielectric layer 50 is configured to fix the electronic component 20 along with the dielectric layer 70 in the cavity 10C.

The dielectric layer 50 may include a resin layer. In some embodiments, the dielectric layer 50 includes a thermoplastic material such as acrylonitrile butadiene styrene (ABS). While the dielectric layer 50 may have a relatively large CTE and thus tend to expand and contract when subjected to a temperature change, and such volume change may result in warpage of the package structure 1. In some embodiments, a modulus of the connection element 30 is greater than a modulus of the dielectric layer 50 and substantially equals a modulus of the magnetic layer 22, and thus the aforementioned warpage can be mitigated or prevented.

The insulation layers 60 may be disposed over the surfaces 101 and 102 of the substrate 10. In some embodiments, the insulation layer 60 covers the end surface (e.g., the surface 31 of the connection element 30 and the surface 31' of the connection element 30') exposed by the surface 701 of the dielectric layer 70. In some embodiments, the insulation layer 60 covers the end surface (e.g., the surface 32 of the connection element 30 and the surface 32' of the connection element 30') exposed by the surface 702 of the dielectric layer 70. The insulation layer 60 may be disposed over the surfaces 701 and 702 of the dielectric layer 70. In some embodiments, the insulation layers 60 may include Pre-preg, polypropylene (PP), a resin material (e.g., epoxy-based resin), or other suitable dielectric or insulative materials. In some embodiments, the insulation layer 60 may include epoxy with a surface coated with metal, such as copper.

In some cases, an inductor is electrically connected to a substrate through a conductive via (or a connection element) which penetrates a magnetic material of the inductor. However, the quality of the magnetic material of the inductor is severely impacted since the relatively high temperature from the laser drilling of forming the conductive via can re-melt the magnetic material, and result in an undesired irregular morphology of the inner wall of the drilled hole and the plating chemical solution used in forming the conductive via can erode the magnetic material, and unavoidably cause cracking, delamination, or other similar types of damage. Furthermore, the operation of forming the hole (also referred to as "blind hole") for the conductive via limits yield due to the difficulty of aligning the hole to the exact predetermined position of the embedded conductive wire of the inductor. Moreover, the magnetic material is opaque, which further increases the difficulty of aligning the hole to the embedded conductive wire of the inductor.

In contrast, according to some embodiments of the present disclosure, with the design of the connection element 30 (or 30') penetrating the dielectric layer 70 and in connection to the protruding portion 241 (or 243) of the conductive wire 24 of the electronic component 20 (e.g., the inductor), the magnetic layer 22 of the electronic component 20 remains intact. As such, the re-melting and the damage of the magnetic layer 22 of the electronic component 20 can be avoided. The quality of the electronic component 20 may be improved, or at least no deterioration is incurred when forming the electrical connection between the electronic component 20 and the substrate 10. This simplifies process and increases yield.

The protruding portions 241 and 243 of the conductive wire 24 are originally redundant and removed once the factory receives the electronic component 20. In the present disclosure, the protruding portions 241 and 243 are kept and utilized to form the electrical connection between the electronic component 20 and the substrate 10. This simplifies process.

Furthermore, since the magnetic layer 22 of the electronic component 20 remains intact (e.g., no holes formed in the magnetic layer 22) during the formation of the electrical connection between the electronic component 20 and the substrate 10, the volume of the magnetic layer 22 is relatively larger than the inductor of which the magnetic material includes holes, e.g. blind holes. Thus, the inductance value of the electronic component 20 is relatively large. Meanwhile, the DC impedance of the electronic component 20 can be optimized.

Moreover, the dielectric layer 70 may be transparent and thus the protruding portion 241 or 243 (supposed opening) can be observed manually or by machine. This facilitates alignment in the mechanical drilling of the hole formation, which will be filled with conductive material to form the connection elements 30 (or 30'), that will be described later in FIGS. 4A1-4N.

Owing to the mechanical drilling, the shape of the connection elements 30 (or 30') may be smoother than, e.g., with laser drilling. The portions 241 and 243 of the conductive wire 24 that are exposed to the through holes 70S to contact the connection elements 30 and 30' have relatively flat and large contact surfaces, improving the electrical connection between the conductive wires and the connection element 30 (or 30').

Furthermore, according to some embodiments of the present disclosure, the connection element 30 (30') penetrates the dielectric layer 70 and connects the portion 241 (or 243) of the conductive wire 24, thus the conductive vias 41 and 42 may be formed on opposite sides of the electronic component 20 according to the actual applications of the circuit designs rather than on only one side of the electronic component 20, and therefore the routing flexibility of conductive patterns can be increased.

Figure 2:
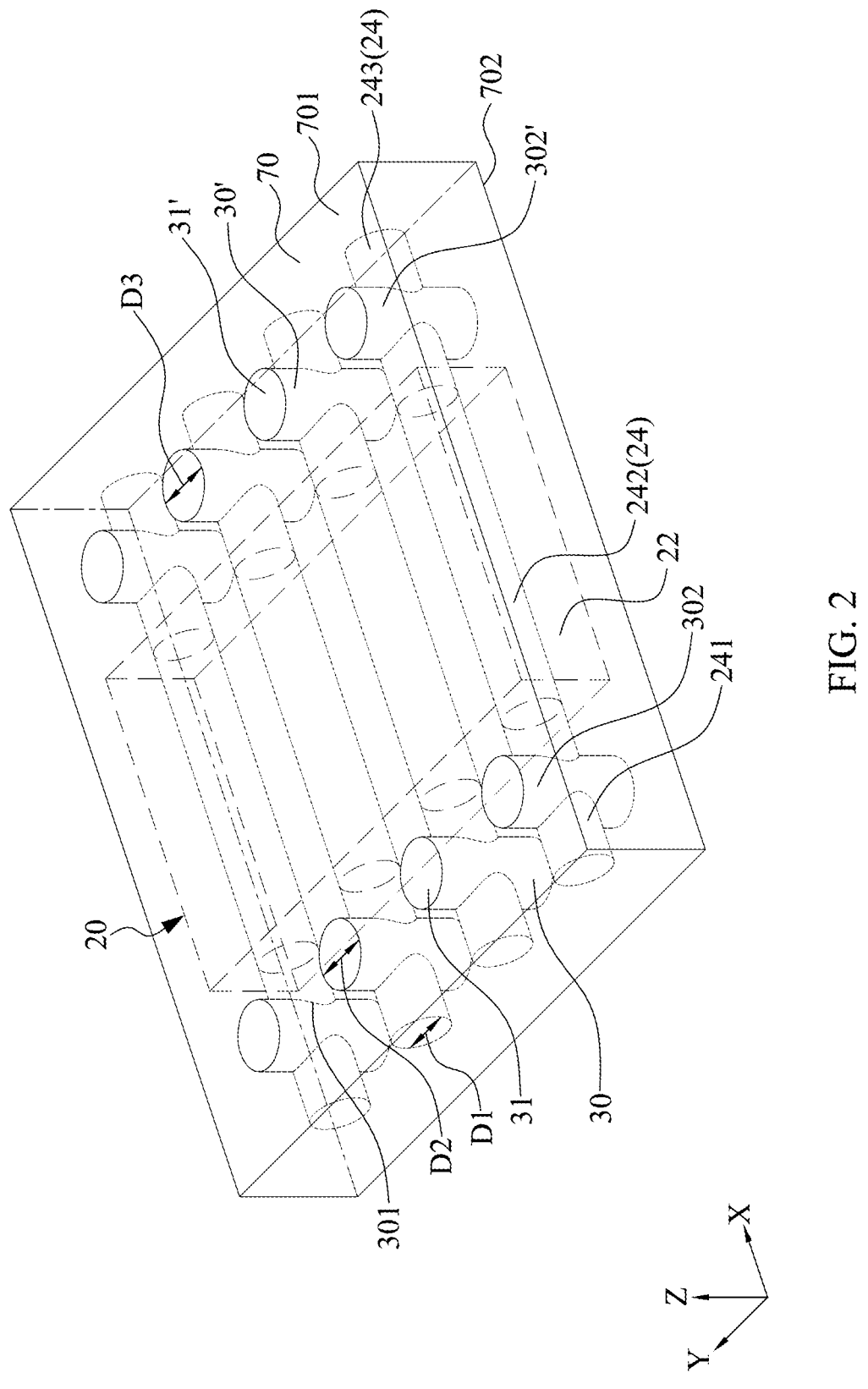
FIG. 2 is a schematic perspective view of a portion of a package structure in accordance with some embodiments of the present disclosure.

FIG. 2 is a schematic perspective view of a portion of a package structure 1 in accordance with some embodiments of the present disclosure. In some embodiments, FIG. 2 is a schematic perspective view of the electronic component 20, the connection elements 30 and 30', and the dielectric layer 70 in FIG. 1.

In some embodiments, the electronic component 20 includes a plurality of conductive wires 24 embedded in the magnetic layer 22, and the electronic component 20 may include a plurality of inductors embedded in the magnetic layer 22. In some embodiments, the conductive wires 24 are substantially straight parallel wires extending along an axis (e.g., X-axis) or the direction of the X-axis. In some embodiments, a width D1 (e.g., a diameter) of the conductive wire 24 equal or is less than a width D2 (e.g., a diameter) of the connection element 30 along an axis (e.g., Y-axis) or the direction of the Y-axis. In some embodiments, the width D1 (e.g., the diameter) of the conductive wire 24 equal or is less than a width D3 (e.g., a diameter) of the connection element 30' along an axis (e.g., Y-axis) or the direction of the Y-axis. The connection element 30 (or 30') may have a circular shape in a top view.

In some embodiments, a portion of a peripheral surface of the conductive wire 24 is covered by the connection element 30. In some embodiments, a portion of a peripheral surface of the conductive wire 24 is surrounded by the connection element 30. In some embodiments, a portion of a peripheral surface of the conductive wire 24 is covered by the connection element 30'. In some embodiments, a portion of a peripheral surface of the conductive wire 24 is surrounded by the connection element 30'. In some embodiments, a portion of a peripheral surface of the conductive wire 24 is covered by the dielectric layer 70. In some embodiments, a lateral surface 302 of the connection element 30 may be covered by the dielectric layer 70. A portion of the lateral surface 302' of the connection element 30' may be covered by the dielectric layer 70.

Figure 2A:
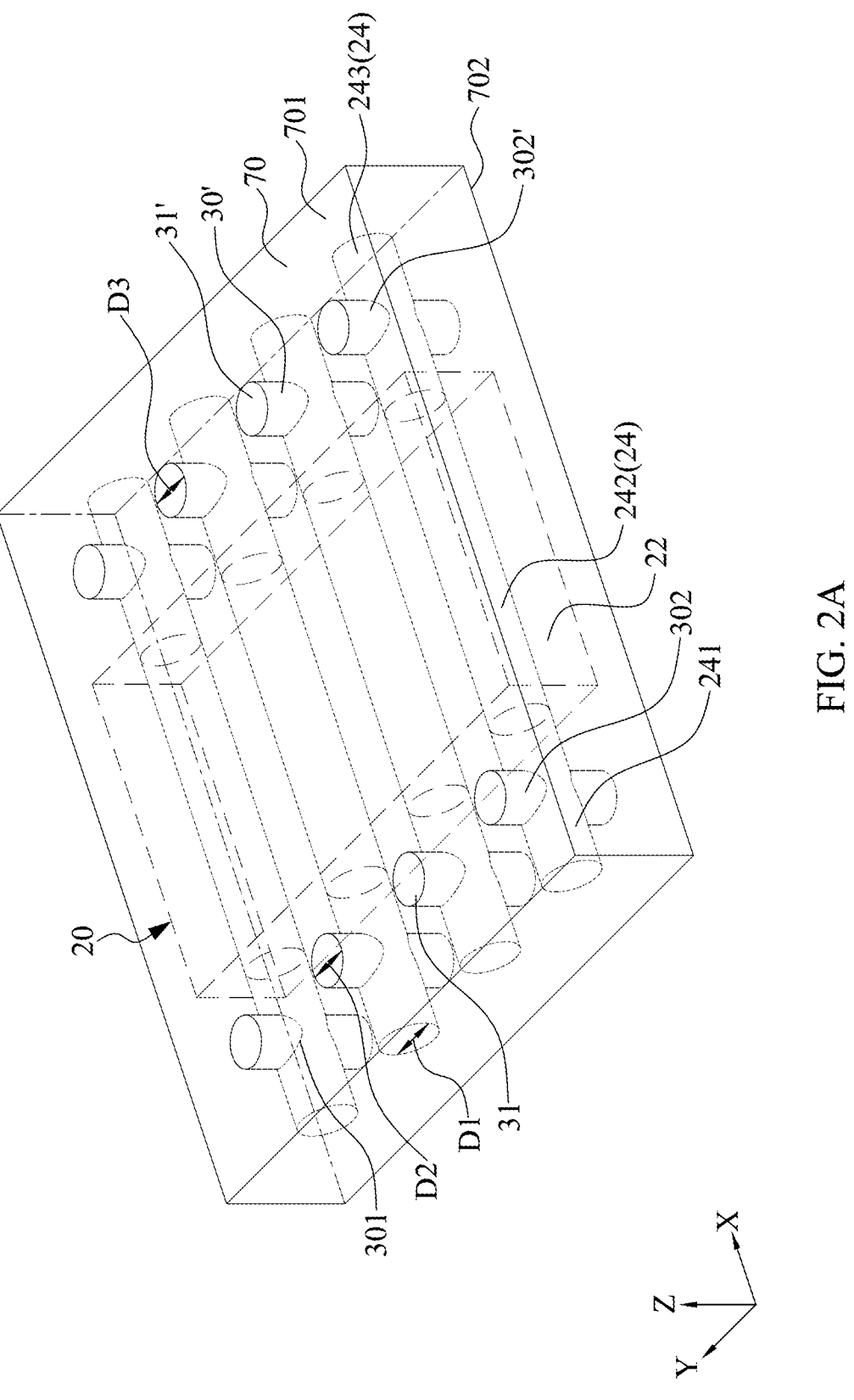
FIG. 2A is a schematic perspective view of a portion of a package structure in accordance with some embodiments of the present disclosure.

FIG. 2A is a schematic perspective view of a portion of a package structure 1 in accordance with some embodiments of the present disclosure. In some embodiments, FIG. 2A is a schematic perspective view of the electronic component 20, the connection elements 30 and 30', and the dielectric layer 70 in FIG. 1.

In some embodiments, the electronic component 20 includes a plurality of conductive wires 24 embedded in the magnetic layer 22, and the electronic component 20 may include a plurality of inductors embedded in the magnetic layer 22. In some embodiments, the conductive wires 24 are substantially straight parallel wires extending along an axis (e.g., X-axis) or the direction of the X-axis. In some embodiments, a width D1 (e.g., a diameter) of the conductive wire 24 equals or exceeds a width D2 (e.g., a diameter) of the connection element 30 along an axis (e.g., Y-axis) or the direction of the Y-axis. In some embodiments, the width D1 (e.g., the diameter) of the conductive wire 24 equals or exceeds a width D3 (e.g., a diameter) of the connection element 30' along an axis (e.g., Y-axis) or the direction of the Y-axis. The at least one lateral surface 301 of the connection element 30 may be completely surrounded by the conductive wire 24.

Figure 3A:
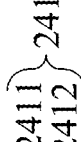
FIG. 3A is a cross-section of a portion of a package structure in accordance with some embodiments of the present disclosure.

FIG. 3A is a cross-section of a portion of a package structure 1 in accordance with some embodiments of the present disclosure. FIG. 3A may be an enlarged cross-section of box B1 in FIG. 1.

As shown in FIG. 3A, the portion 241 of the conductive wire 24 may include a segment 2411 and a segment 2412 spaced apart from the segment 2411 by the connection element 30. The segment 2411 may be electrically connected to the segment 2412 through the connection element 30. The connection element 70 may include a plurality of segments 30N surrounded by the dielectric layer 70 and a segment 30M connecting the segments 30N and surrounded by the conductive wire 24. The segments 30N and 30M may have substantially the same diameter D2.

The conductive wire 24 may be copper wire and the connection element 30 may be electroplated copper which has a lattice arrangement different from that of the copper wire. A lattice mismatch between the conductive wire 24 and the connection element 30 can be observable at the contact interface 301 because of the different lattice arrangements of the conductive wire 24 and the connection element 30. In some embodiments, when the connection element 30 is conductive gel or solder, the boundary between the conductive wire 24 and the connection element 30 can be observable at the contact interface 301.

Figure 3B:
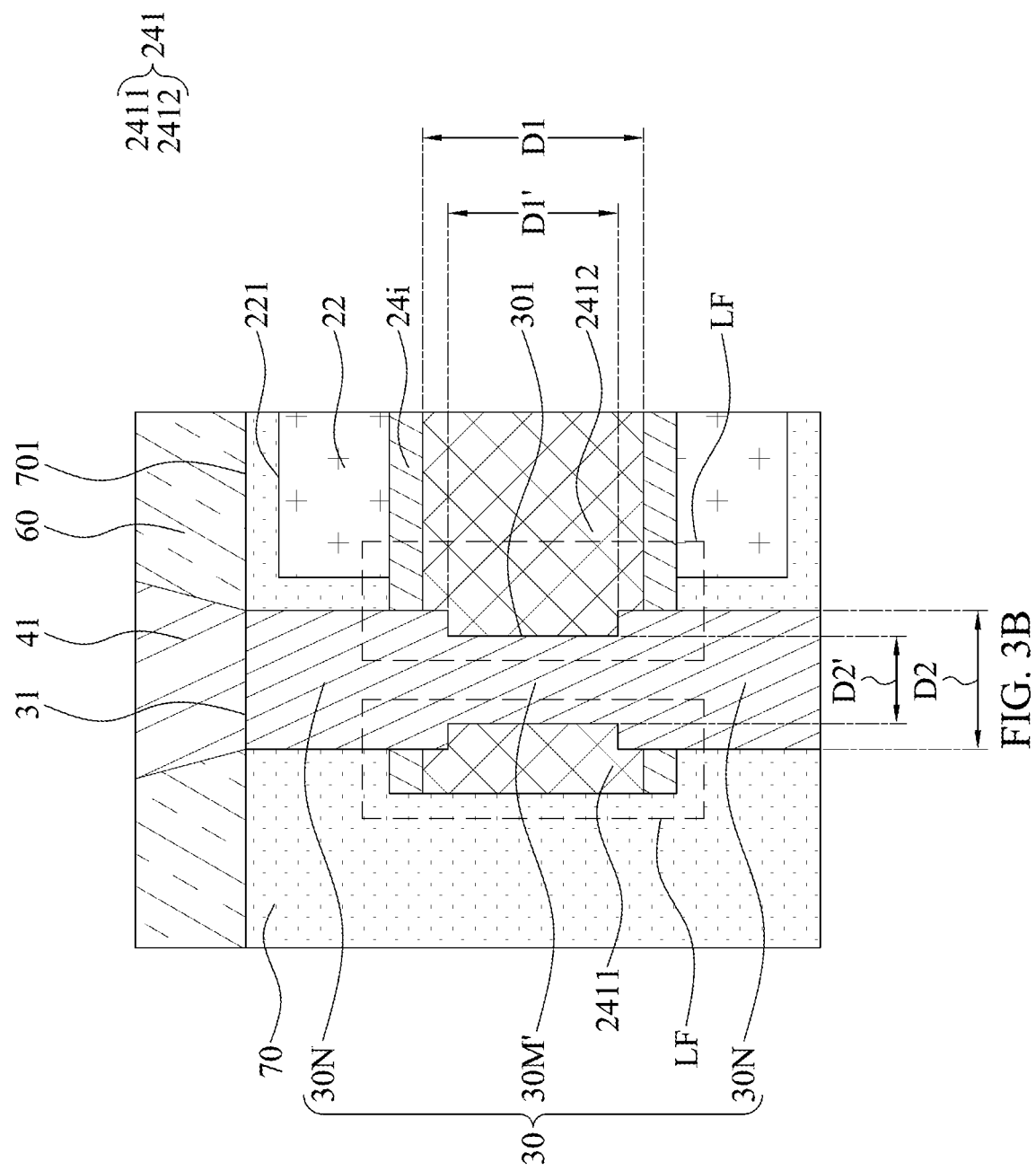
FIG. 3B is a cross-section of a portion of a package structure in accordance with some embodiments of the present disclosure.

FIG. 3B is a cross-section of a portion of a package structure in accordance with some embodiments of the present disclosure. FIG. 3B may be an enlarged cross-section of box B1 in FIG. 1.

The connection element 70 may include a plurality of segments 30N surrounded by the dielectric layer 70 and a segment 30M' connecting the segments 30N and surrounded by the conductive wire 24. The at least one lateral surface 301 of the connection element 30 may have a step structure. The connection element 30 and the conductive wire 24 may collectively form a latch structure LF. The latch structure LF may reinforce the bondability between the connection element 30 and the conductive wire 24. In some embodiments, the latch structure LF may be configured to lock the connection element 30 and the conductive wire 24 in the direction of Z-axis. The segments 30N may have a diameter D2 and the segment 30M may have a diameter D3 less than the diameter D2. The segments 2411 and 2412 may have a diameter D1' in the region of the latch structure LF, less than the diameter D1. The latch structure LF may be formed by a plurality of steps of the mechanical drilling, including fine drilling of the dielectric layer 70 and the conductive wire and coarse drilling of the dielectric layer 70 and the conductive wire with a larger drilling diameter from the upper and the lower side of the dielectric layer 70.

Figure 3C:
FIG. 3C is a cross-section of a portion of a package structure in accordance with some embodiments of the present disclosure.

FIG. 3C is a cross-section of a portion of a package structure in accordance with some embodiments of the present disclosure. FIG. 3C may be an enlarged cross-section of box B1 in FIG. 1.

The conductive via 41 may have a seed layer 41R disposed along a lower surface and a lateral surface of the conductive via 41. The seed layer 41R may be in contact with the surface 31 of the connection element 30. The connection element 30 may have a seed layer 30R disposed along the lateral surface 301. The seed layer 30R of the connection element 30 may be in contact with the conductive wire 24.

FIG. 4A1, FIG. 4A2, FIG. 4B1, FIG. 4B2, FIG. 4C1, FIG. 4C2, FIG. 4D1, FIG. 4D2, FIG. 4E, FIG. 4F, FIG. 4G, FIG. 4H, FIG. 4I, FIG. 4J, FIG. 4K, and FIG. 4L illustrate various operations in a method of manufacturing a package structure 1 in accordance with some embodiments of the present disclosure.

Referring to FIG. 4A1, which is a perspective top view, and FIG. 4A2, which is a cross-section along an axis 4A2-4A2' in FIG. 4A1, an electronic component 20 including a magnetic layer 22 and conductive wires 24 encapsulated by the magnetic layer 22 may be formed. The conductive wire 24 may have portions 241 and 243 exposed by and protruding from the magnetic layer 22 and a portion 242 enclosed by the magnetic layer 22. The electronic component 20 may include an insulation layer 24i surrounding the conductive wire 24.

Referring to FIG. 4B1 which is a perspective top view, and FIG. 4B2, which is a cross-section along an axis 4B2-4B2' in FIG. 4B1, a dielectric layer 70 may be formed to encapsulate or enclose the electronic component 20. The portions 241 and 243 of the conductive wire 24 may be encapsulated or enclosed by the electronic component 20. The dielectric layer 70 may be formed by a molding process, for example but not limited to, a compression molding, transfer molding, etc.

Referring to FIG. 4C1 which is a perspective top view, and FIG. 4C2, which is a cross-section along an axis 4C2-4C2' in FIG. 4C1, one or more through holes 70S may be formed to penetrate the dielectric layer 70 and the protruding portions 241 and 243 of the conductive wires 24. The magnetic layer 22 may remain intact during the forming of the through holes 70S. The portions 241 and 243 may be exposed by the through holes 70S. The through holes 70S may have a circular shape in a top view. The formation through holes 70S may include a single step mechanical drilling or a multiple step mechanical drilling to form the latch structure LF as discussed in FIG. 3B.

Referring to FIG. 4D1 which is a perspective top view, and FIG. 4D2, which is a cross-section along an axis 4D2-4D2' in FIG. 4D1, a conductive material (e.g., conductive gel, solder, or electroplated material) may be formed in the through holes 70S to form connection elements 30 and 30' penetrating the dielectric layer 70 and in contact with the conductive wire 24. The connection element 30 (or 30') may have a circular shape in a top view. In some embodiments, a seed layer along the sidewall of the through holes 70 may be formed prior to the formation of the conductive material.

Figure 4E:
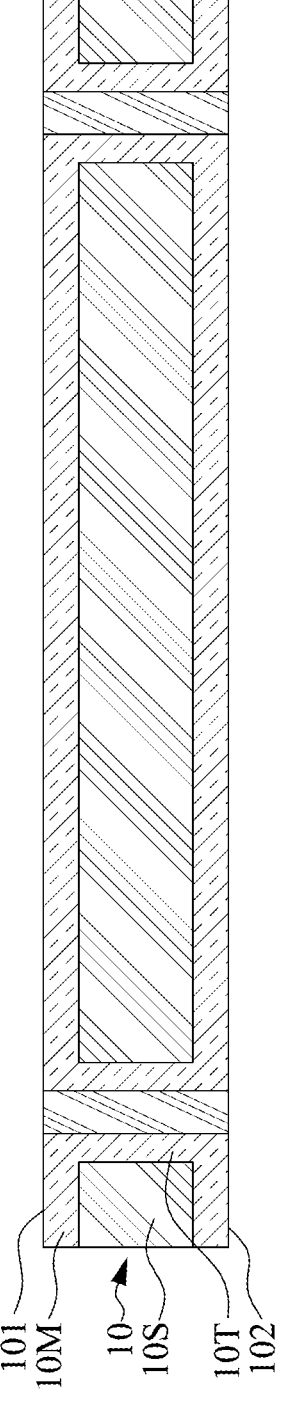
Figure 4E:
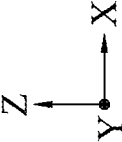

Referring to FIG. 4E, a substrate 10 may be provided. In some embodiments, the substrate 10 includes a supporting portion 10S (or a core layer), conductive layers 10M, and conductive structures 10T. In some embodiments, the substrate 10 is a core substrate.

Figure 4F:
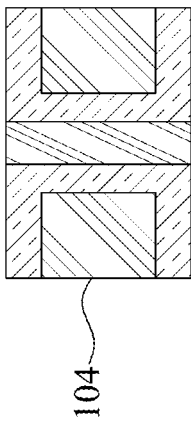
Figure 4F:
Figure 4F:
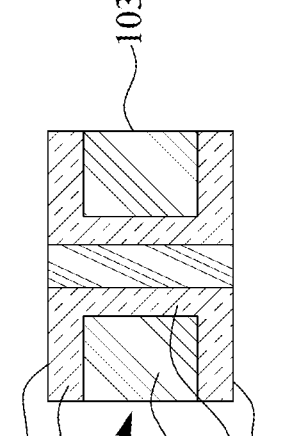
Figure 4F:
Figure 4F:
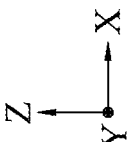

Referring to FIG. 4F, a cavity 10C may be formed in the substrate 10. In some embodiments, the cavity 10C penetrates the substrate 10.

Referring to FIG. 4G, the substrate 10 may be adhered to a carrier 710 through an adhesive layer 720 to seal the cavity 10C. In some embodiments, the carrier 710 serves to provide rigid support for the adhesive layer 720. In some embodiments, the adhesive layer 720 includes a tape. In some embodiments, a thickness of the carrier 710 is equal to or less than a thickness of the magnetic layer 22.

Figure 4H:
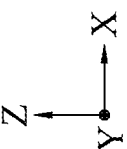

Referring to FIG. 4H, the electronic component 20 with the connection elements 30 and 30' and the dielectric layer 70 illustrated in FIG. 4D2 may be disposed in the cavity 10C and fixed with the adhesive layer 720.

Figure 4I:
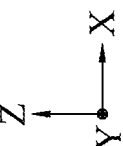

Referring to FIG. 4I, a dielectric layer 50 may be formed in the cavity 10C to surround the dielectric layer 70. In some embodiments, the dielectric layer 50 may be flowable (e.g., fluid), and the dielectric layer 50 may fill the cavity 10C and between the dielectric layer 70 and the supporting portion 10S of the substrate 10. The dielectric layer 50 may be thermally and/or optically cured to solidify. In some embodiments, the dielectric layer 50 may be configured to fix the electronic component 20 and the dielectric layer 70 in the cavity 10C. In some embodiments, a grinding operation may be performed to remove excess materials of the dielectric layer 50 over the surface 101 of the substrate 10, the surface 221 of the electronic component 20, and the surface 701 of the dielectric layer 70 to expose the conductive layers 10M and the connection elements 30.

Figure 4J:
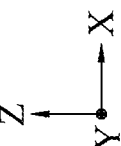

Referring to FIG. 4J, the electronic component 20, the dielectric layers 50 and 70 may be ground to provide the connection element 30 (or 30') with a flat or planarized surface (e.g., the surface 31 (or 31')) for improving electrical connection between the connection element 30 and the conductive via 41 which will be formed subsequently. The magnetic layer 22 is intact during the grinding. An upper surface 701 of the dielectric layer 70, an upper surface 51 of the dielectric layer 50, and the surface 31 (or 31') may be substantially coplanar.

Figure 4K:
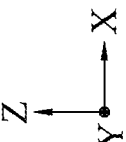

Referring to FIG. 4K, an insulation layer 60 may be formed on the surface 101 of the substrate 10, the carrier 710 and the adhesive layer 720 may be removed, and then an insulation layer 60' may be formed on the surface 102 of the substrate 10. In some embodiments, the insulation layers 60 (or 60') may be formed by lamination. In some embodiments, the insulation layer 60 (or 60') may be formed over the dielectric layers 50 and 70. The insulation layers 60 (or 60') may include Pre-preg, polypropylene (PP), a resin material (e.g., epoxy-based resin), or other suitable dielectric or insulative materials.

Figure 4L:
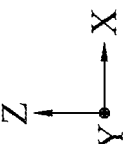

Referring to FIG. 4L, portions of the insulation layers 60 may be removed to form vias exposing portions of the surfaces 101 and 102 of the substrate 10, and conductive patterns 40 and 40' may be formed on the insulation layers 60. The vias may be formed by one or more laser drilling operations. In some embodiments, conductive materials may be formed on the surfaces 101 and 102 and in the vias of the insulation layers 60 by one or more plating operations to form the conductive patterns 40 and 40' and the conductive vias 41 and 42. Furthermore, a conductive via 41 of the conductive pattern 40 may be formed through the insulation layer to electrically connect to the connection element 30. Furthermore, a conductive via 42 of the conductive pattern 40' may be formed through the insulation layer to electrically connect to the connection element 30'. As such, the package structure 1 illustrated in FIG. 1 is formed.

Furthermore, the through holes 70S are spaced apart from the magnetic layer 22 by the dielectric layer 70, which allows more options for forming the connection elements 30 and 30'. For example, the connection elements 30 and 30' may be formed by an electroplating operation. Damage to the magnetic material induced by the erosion of the plating chemical solution can thus be prevented.

Moreover, the dielectric layer 70 may be transparent and thus the protruding portion 241 or 243 (supposed opening) can be observed in the mechanical drilling operation. This facilitates alignment in the mechanical drilling of the through holes 70S.

Furthermore, laser drilling may be unable to form a relatively flat or planarized surface for electrical contact. For example, the conductive wire exposed by a laser-drilled via may still have a curved surface rather than a flat surface. In contrast, according to some embodiments of the present disclosure, with formation of the through holes 70S by mechanical drilling, the portions 241 and 243 of the conductive wire 24 that are exposed to the through holes 70S to contact the connection elements 30 and 30' have relatively flat and large contact surfaces, improving the electrical connection between the conductive wires and the connection element 30 (or 30').

Furthermore, according to some embodiments of the present disclosure, the electrical connection between the electronic component 20 and the substrate 10 can be achieved by simply performing electronic device encapsulating (by the dielectric layer 70), mechanical drilling, and electroplating (or conductive gel/paste filling). The manufacturing process is simplified, and the time required is reduced.

FIG. 5 is a cross-section of a package structure 2 in accordance with some embodiments of the present disclosure. The package structure 2 in FIG. 5 is similar to the package structure 1 in FIG. 1. Therefore, some detailed descriptions may refer to corresponding preceding paragraphs and are not repeated hereinafter for conciseness, with differences therebetween as follows.

The package structure 2 may include connection elements 80 and 80', rather than the connection elements 30 and 30' in FIG. 1.

The connection element 80 may extend along the dielectric layer 70. The connection element 80 may penetrate the surface 701 of the dielectric layer 70 but not reach the surface 702 of the dielectric layer 70. The connection element 80 may be embedded in the dielectric layer 70. The connection element 80 may be enclosed (or surrounded) by the dielectric layer 70. The connection element 80 may extend along an axis (e.g., Z-axis) substantially perpendicular to another axis (e.g., X-axis) along which the electronic component 20 (or the conductive wire 24) extends. The connection element 80 may extend along the surface 223 of the magnetic layer 22 and be disposed exterior to the magnetic layer 22. The connection element 80 may penetrate a perimeter of the portion 241 of the conductive wire 24. The connection element 80 may have an end surface 82 in the conductive wire 24. The end surface 82 may be at the central axis of the conductive wire 24. The connection element 80 may connect to the conductive wire 24, thereby forming a contact interface 801 between the conductive wire 24 and the connection element 80.

In some embodiments, the connection element 80 has a surface 81 opposite to the surface 82. The surface 81 of the connection element 80 and the surface 701 of the dielectric layer 70 may be substantially coplanar. The surface 81 of the connection element 80 may be exposed by the surface 701 of the dielectric layer 70.

In some embodiments, the conductive wire 24 are electrically connected by the connection element 80. In some embodiments, the portion 241 of the conductive wire 24 may be electrically connected by the connection element 80. In some embodiments, the connection element 80 is configured to electrically connect to the conductive wire 24 and the substrate 10. In some embodiments, the connection element 80 may electrically connect to the substrate 10 through the conductive pattern 40. The connection element 80 may have a surface 81 connected to the conductive pattern 40 (or the conductive via 41).

In some embodiments, the connection element 80 may be separated from the magnetic layer 22. A vertical footprint of the connection element 80 may be free from overlapping the vertical footprint 22F of the magnetic layer 22. As shown in FIG. 1, the vertical footprint of the connection element 80 may be a projecting area of the connection element 80 on the surface 102 of the substrate 10. In some embodiments, the contact interface 801 may be free from vertically overlapping the magnetic layer 22.

The connection element 80' may penetrate the dielectric layer 70. The connection element 80' may penetrate the surface 702 of the dielectric layer 70 but not reach the surface 701 of the dielectric layer 70. The connection element 80' may be embedded in the dielectric layer 70. The connection element 80' may be enclosed (or surrounded) by the dielectric layer 70. The connection element 80' may extend along an axis (e.g., Z-axis) substantially perpendicular to another axis (e.g., X-axis) along which the electronic component 20 (or the conductive wire 24) extends. The connection element 80' may extend along the surface 224 of the magnetic layer 22 and be disposed exterior to the magnetic layer 22. The connection element 80' may penetrate a perimeter of the portion 243 of the conductive wire 24. The connection element 80' may have an end surface 82' in the conductive wire 24. The end surface 82' may be at the central axis of the conductive wire 24. The connection element 80' may connect to the conductive wire 24, thereby forming a contact interface 801' between the conductive wire 24 and the connection element 80'.

In some embodiments, the connection element 80' has a surface 81' opposite to the surface 82'. The surface 81' of the connection element 80' and the surface 701 of the dielectric layer 70 may be substantially coplanar. The surface 81' of the connection element 80' may be exposed by the surface 702 of the dielectric layer 70.

In some embodiments, the conductive wire 24 is electrically connected by the connection element 80'. In some embodiments, the portion 243 of the conductive wire 24 may be electrically connected by the connection element 80'. In some embodiments, the connection element 80' is configured to electrically connect to the conductive wire 24 and the substrate 10. In some embodiments, the connection element 80' may electrically connect to the substrate 10 through the conductive pattern 40'. The connection element 801 may have a surface 82' connected to the conductive pattern 40' (or the conductive via 42).

In some embodiments, the connection element 80' may be separated from the magnetic layer 22. A vertical footprint of the connection element 80' may be free from overlapping the vertical footprint 22F of the magnetic layer 22. As shown in FIG. 1, the vertical footprint of the connection element 80' may be a projecting area of the connection element 80' on the surface 102 of the substrate 10. In some embodiments, the contact interface 801' may be free from vertically overlapping the magnetic layer 22.

In some embodiments, a modulus of the conductive wire 24 is greater than or exceeds a modulus of the connection element 80 (or 80'). The modulus of the connection element 80 may be larger than 130 GPa. In some embodiments, the modulus of the connection element 80 (or 80') substantially equals a modulus of the magnetic layer 22.

In some embodiments, a CTE of the connection element 80 (or 80') substantially equals a CTE of the magnetic layer 22. The CTE of the connection element 80 (or 80') may be $1.65 \times 10^{-5}$° $C.^{-1}$.

In some embodiments, the connection element 80 (or 80') includes an electro-plating conductive layer. In some embodiments, the connection element 80 (or 80') includes solder. In some embodiments, the connection element 80 (or 80') includes conductive gel or paste. In some embodiments, the connection element 80 (or 80') includes a resin layer and a conductive material dispersed in the resin layer. The conductive wire 24 and the connection element 80 (or 80') may be composed of different materials. A lattice arrangement of the connection element 80 (or 80') may be different from a lattice arrangement of the conductive wire 24.

The package structure 2 may provide at least similar or identical technical effect to that of package structure 1.

Figure 6:
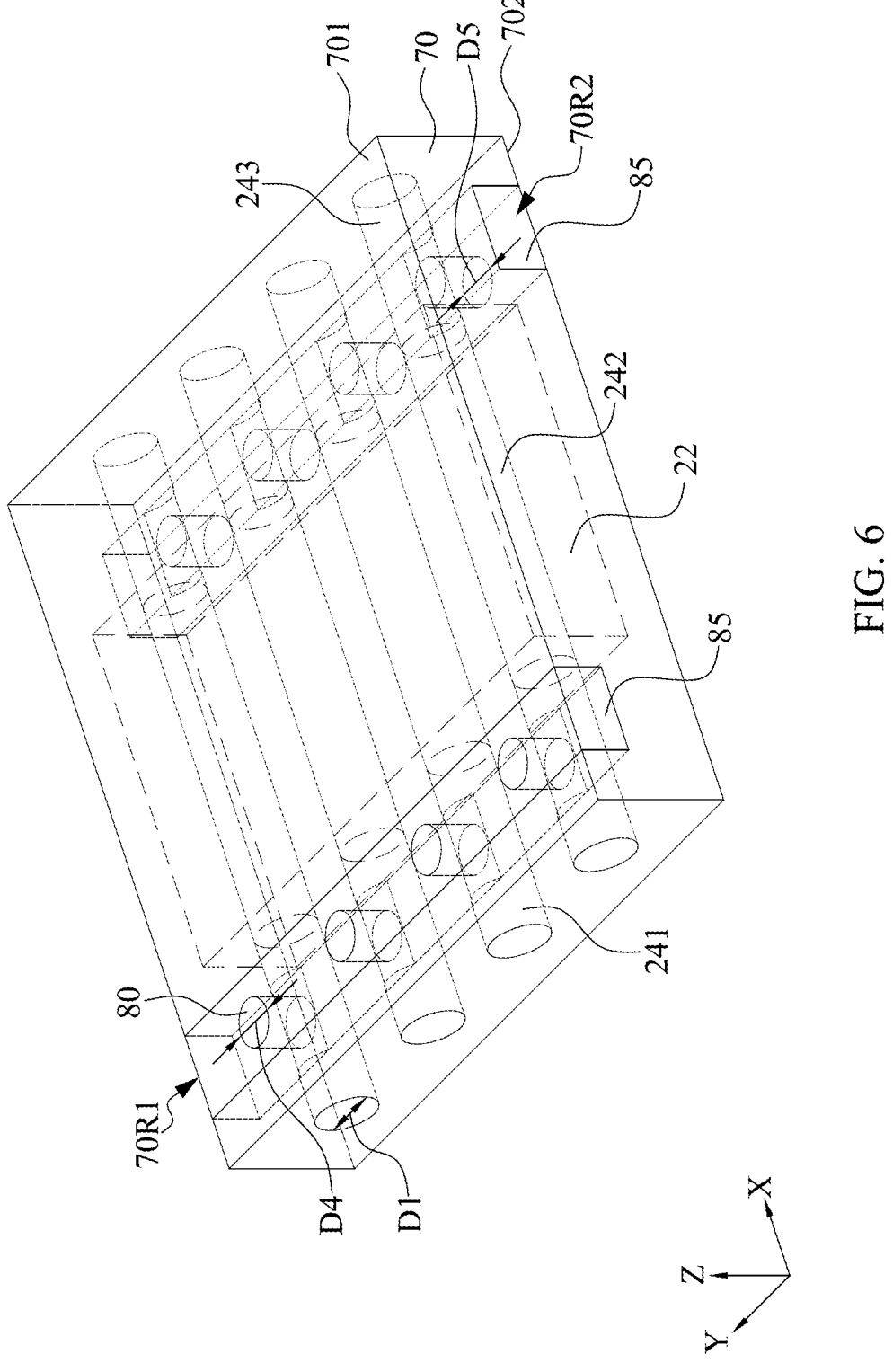
FIG. 6 is a schematic perspective view of a portion of a package structure in accordance with some embodiments of the present disclosure.

FIG. 6 is a schematic perspective view of a portion of a package structure 2 in accordance with some embodiments of the present disclosure. In some embodiments, FIG. 6 is a schematic perspective view of the electronic component 20, the connection elements 80 and 80', and the dielectric layer 70 in FIG. 1.

One or more recesses 70R1 and 70R2 may be defined in the dielectric layer 70. A dielectric layer 85 may be disposed in the recess 70R1 and 70R2. The one or more connection elements 80 may be disposed in the recess 70R1 and surrounded by the dielectric layer 85. The one or more connection elements 80' may be disposed in the recess 70R2 and surrounded by the dielectric layer 85. The recess 70R1 may have a portion of a lower surface in the portion 241 of the conductive wires 24. The recess 70R2 may have a portion of an upper surface in the portion 243 of the conductive wires 24. The recess 70R1 and the recess 70R2 may be a slot or a trench continuously traversing the portions 241 and 243 of the conductive wires 24. The recess 70R1 and the recess 70R2 may include a substantially vertical sidewall profile, or an inclined sidewall profile.

In some embodiments, the electronic component 20 includes a plurality of conductive wires 24 embedded in the magnetic layer 22, and the electronic component 20 may include a plurality of inductors embedded in the magnetic layer 22. In some embodiments, the conductive wires 24 are substantially straight parallel wires extending along an axis (e.g., X-axis). In some embodiments, a width D1 (e.g., a diameter) of the conductive wire 24 exceeds a width D4 (e.g., a diameter) of the connection element 80 along an axis (e.g., Y-axis) or the direction of the Y-axis. In some embodiments, the width D1 (e.g., the diameter) of the conductive wire 24 is equals or exceeds a width D5 (e.g., a diameter) of the connection element 80' along an axis (e.g., Y-axis) or the direction of the Y-axis. The connection element 80 (or 80') may have a circular shape in a top view. The widths D4 and D5 of the connection elements 80 and 80' may be less than the widths D1 and D3 of the connection elements 80 and 80'. In some embodiments, the widths D4 and D5 may be around 100 μm. The widths D1 and D3 may be around 1 mm.

FIG. 7A1, FIG. 7A2, FIG. 7B1, FIG. 7B2, FIG. 7C, FIG. 7D, FIG. 7E, and FIG. 7F illustrate various operations in a method of manufacturing a package structure 2 in accordance with some embodiments of the present disclosure. The operations in FIGS. 7A1 and 7A2 may follow the operations in FIGS. 4B1 and 4B2.

Referring to FIG. 7A1 which is a perspective top view, and FIG. 7A2, which is a cross-section along an axis 7A2-7A2' in FIG. 7A1, the dielectric layer 70 and the portions 241 and 243 of the conductive wires 24 are recessed to form one or more recesses 70R1 and 70R2 partially exposing the portions 241 and 243 of the conductive wire 24. In some embodiments, the recess 70R1 and the recess 70R2 may be formed in a mechanical manner, for example, by a wheel cutter. The wheel cutter may remove the dielectric layer 70 as well as a portion of the conductive wires 24 along an axis perpendicular to the length of the conductive wire 24 such that the recess 70R1 and the recess 70R2 can be a slot or a trench continuously traversing the portions 241 and 243 of the conductive wires 24. The recess 70R1 and the recess 70R2 may include a substantially vertical sidewall profile, or an inclined sidewall profile.

Referring to FIG. 7B1 which is a perspective top view, and FIG. 7B2, which is a cross-section along an axis 7B2-7B2' in FIG. 7B1, a dielectric layer 85 is formed in the recess 70R1 and the recess 70R2. In some embodiments, the dielectric layer 85 may be flowable, and the fluid of the dielectric layer 85 may be filled in the recess 70R1 and the recess 70R2.

Referring again to FIG. 7B1 which is a perspective top view, and FIG. 7B2, which is a cross-section along an axis 7B2-7B2' in FIG. 7B1, a plurality of blind holes 85S may be formed in the dielectric layer 85, each of which correspond to one conductive wire 24. A conductive material (e.g., a conductive gel, a solder, or electroplated material) may be then be formed in the blind holes 85S to form connection elements 80 and 80' in the recesses 70R1 and 70R2 and in contact with the conductive wire 24. The connection element 80 (or 80') may have a circular shape in a top view. In some embodiments, a seed layer along the sidewall of the through holes 85S may be formed prior to the formation of the conductive material.

Figure 7C:
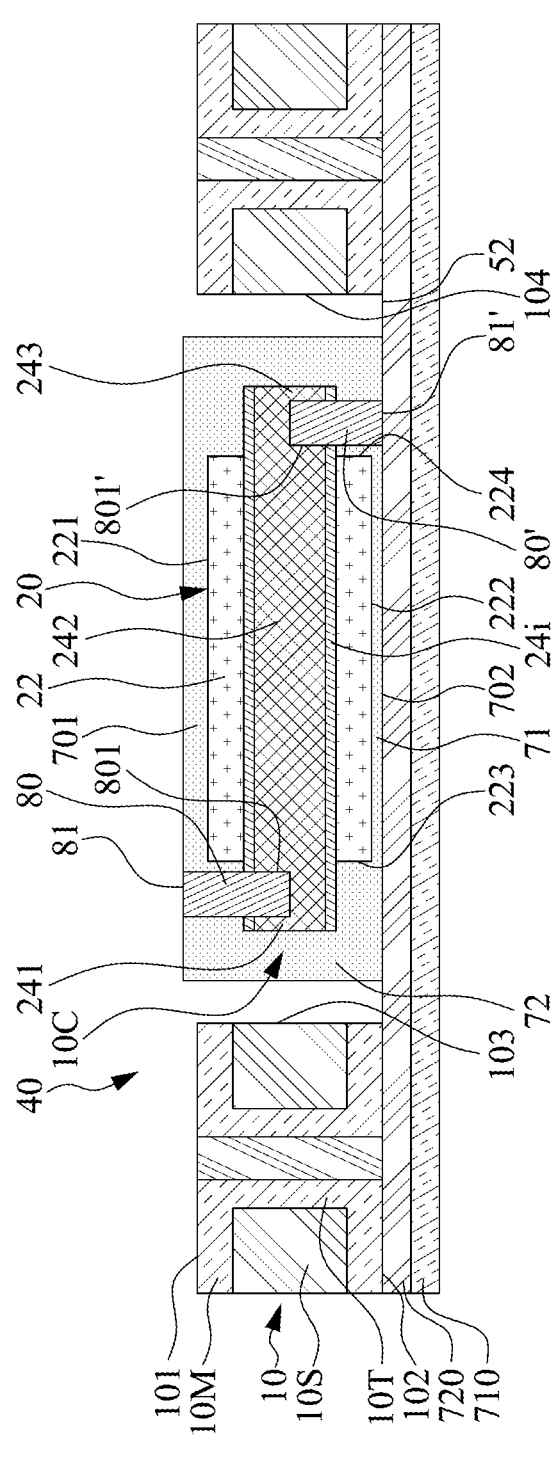

Referring to FIG. 7C, the electronic component 20 with the connection elements 80 and 80' and the dielectric layer 70 illustrated in FIG. 7B2 may be disposed in the cavity 10C and fixed with the adhesive layer 720.

Referring to FIG. 7D, a dielectric layer 50 may be formed in the cavity 10C. In some embodiments, the dielectric layer 50 may be flowable (e.g., fluid), and the dielectric layer 50 may fill the cavity 10C and between the dielectric layer 70 and the supporting portion 10S of the substrate 10. The dielectric layer 50 may be thermally and/or optically cured to solidify. In some embodiments, the dielectric layer 50 may be configured to fix the electronic component 20 and the dielectric layer 70 in the cavity 10C. In some embodiments, a grinding operation may be performed to remove excess materials of the dielectric layer 50 over the surface 101 of the substrate 10, the surface 221 of the electronic component 20, and the surface 701 of the dielectric layer 70 to expose the conductive layers 10M and the connection elements 80 and 80'.

Referring to FIG. 7E, the electronic component 20, the dielectric layers 50 and 70 may be ground to provide the connection element 80 (or 80') with a flat or planarized surface (e.g., the surface 81 (or 81') for improving electrical connection between the connection element 80 (or 81') and the conductive via 41 (or 42) which will be formed subsequently. An upper surface 701 of the dielectric layer 70, an upper surface 51 of the dielectric layer 50, and the surface 81 may be substantially coplanar. A lower surface 702 of the dielectric layer 70, an upper surface 52 of the dielectric layer 50, and the surface 81' may be substantially coplanar. An insulation layer 60 may be formed on the surface 101 of the substrate 10, the carrier 710 and the adhesive layer 720 may be removed, and then an insulation layer 60 may be formed on the surface 102 of the substrate 10. In some embodiments, the insulation layers 60 may be formed by lamination. In some embodiments, the insulation layer 60 may be formed over the dielectric layers 50 and 70.

Referring to FIG. 7F, portions of the insulation layers 60 may be removed to form vias exposing portions of the surfaces 101 and 102 of the substrate 10, and conductive patterns 40 and 40' may be formed on the insulation layers 60. The vias may be formed by one or more laser drilling operations. In some embodiments, conductive materials may be formed on the surfaces 101 and 102 and in the vias of the insulation layers 60 by one or more plating operations to form the conductive patterns 40 and 40' and the conductive vias 41 and 42. Furthermore, a conductive via 41 of the conductive pattern 40 may be formed through the insulation layer 60 to electrically connect to the connection element 80. A conductive via 42 of the conductive pattern 40 may be formed through the insulation layer 60 to electrically connect to the connection element 80'. As such, the package structure 2 illustrated in FIG. 5 is formed.

Figure 8:
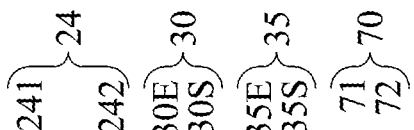
FIG. 8 is a cross-section of a package structure in accordance with some embodiments of the present disclosure.
Figure 8:
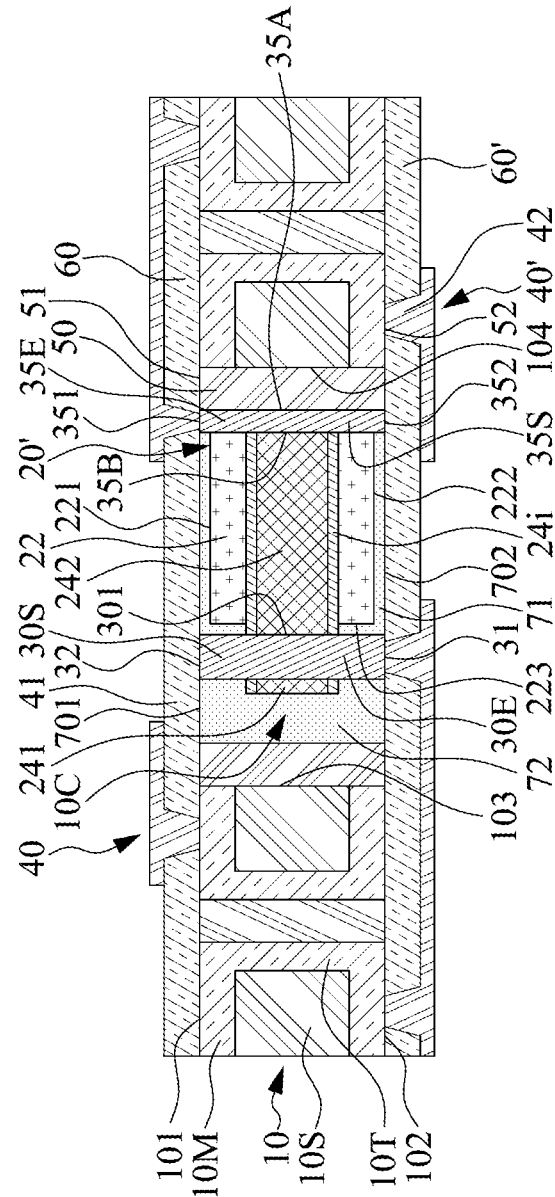
Figure 8:
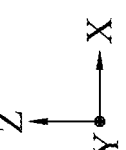

FIG. 8 is a cross-section of a package structure 3 in accordance with some embodiments of the present disclosure. The package structure 3 in FIG. 8 is similar to the package structure 1 in FIG. 1. Therefore, some detailed descriptions may refer to corresponding preceding paragraphs and are not repeated hereinafter for conciseness, with differences therebetween as follows.

The connection element 30 of the package structure 3 may be opposite to that of the package structure 3. For example, the surface 31 of connection element 30 of the package structure 3 may be a lower surface and the surface 32 of connection element 30 of the package structure 3 may be an upper surface. The electrical connection portion 30E may be lower than the supporting portion 30S and electrically connected to the conductive pattern 40'.

The package structure 3 may include a connection element 35, rather than the connection element 30' in FIG. 1 and half, the electronic component 20 in FIG. 1 may be singulated to form a more compact electronic component (or a sub-electronic component) 20'. The connection element 35 may penetrate the electronic component 20' and contact the conductive wire 24. In some embodiments, the connection element 35 penetrates and contacts the magnetic layer 22 and the conductive wire 24. The connection element 35 may be in contact with the dielectric layer 50. The connection element 35 may be partially embedded in the magnetic layer 22. The magnetic layer 22 may be in contact with the dielectric layers 50 and 70. The connection element 35 may extend in the Z-axis and in connection to the conductive wire 24, thereby forming a contact interface 35B between the conductive wire 24 and the connection element 35. The contact interface 35B may be in the magnetic layer 22. The connection element 35 may have a contact interface 35A in the dielectric layer 50. The connection element 35 may be in contact with the dielectric layer 50.

The connection element 35 may have a width (or a diameter) D42 different from the width (or a diameter) D2 of the connection element 30. The diameter D42 may be substantially half the diameter D2.

In some embodiments, a modulus of the conductive wire 24 is greater than or exceeds a modulus of the connection element 35. In some embodiments, the modulus of the connection element 35 substantially equals a modulus of the magnetic layer 22.

In some embodiments, a CTE of the connection element 35 substantially equals a CTE of the magnetic layer 22. The CTE of the connection element 35 may be $1.65\times10^{-5\circ}$ C.$^{-1}$.

In some embodiments, the connection element 35 includes conductive gel, conductive paste, or solder. In some embodiments, the connection element 35 includes a resin layer and a conductive material dispersed in the resin layer.

In some embodiments, the connection element 35 has a surface 351 and a surface 352 opposite to the surface 351. The surface 351 of the connection element 35 and the surface 701 of the dielectric layer 70 may be substantially coplanar. The surface 351 of the connection element 30 may be exposed by the surface 701 of the dielectric layer 70. The surface 352 of the connection element 30 and the surface 702 of the dielectric layer 70 may be substantially coplanar. The surface 352 of the connection element 30 may be exposed by the surface 702 of the dielectric layer 70.

In some embodiments, the connection element 35 includes an electrical connection portion 35E and a support portion 35S may be configured to be in the equal potential when applied with a bias. In some embodiments, the electrical connection portion 35E and the support portion 35S are equipotential. In some embodiments, the electrical connection portion 35E directly contacts or connects to the support portion 35S. In some embodiments, the electrical connection portion 35E and the support portion 35S of the connection element 35 are integrally formed. In some embodiments, the electrical connection portion 35E and the support portion 35S of the connection element 35 are free of an interface therebetween. In some embodiments, the electrical connection portion 35E is configured to electrically connect to the conductive wire 24 and the substrate 10, and the support portion 35S is configured to support the electrical connection portion 35E. In some embodiments, the exposed surface of the electrical connection portion 35E (e.g., the surface 351 of the connection element 35) may electrically connect to the substrate 10 through the conductive pattern 40. In some embodiments, the exposed surface of the support portion 35S (e.g., the surface 352 of the connection element 35) may be free from contacting a conductive feature (e.g., a conductive layer, a conductive pattern, or the like). The dummy structure may have no electrical functionality and may be used to improve process uniformity. In some embodiments, the electrical connection portion 35E and the support portion 35S are located on opposite sides of the conductive wire 24 in cross-section. In an alternative embodiment, the exposed surface of the support portion 35S (e.g., the surface 352 of the connection element 35) may be in contact with a dummy structure of the conductive pattern 40'. According to some embodiments of the present disclosure, with the design of the electrical connection portion 35E and the support portion 35S, warpage can be effectively reduced. In other words, the electrical connection portion 35E and the support portion 35S are collectively configured to mitigate warpage of the package structure 3.

Figure 8A:
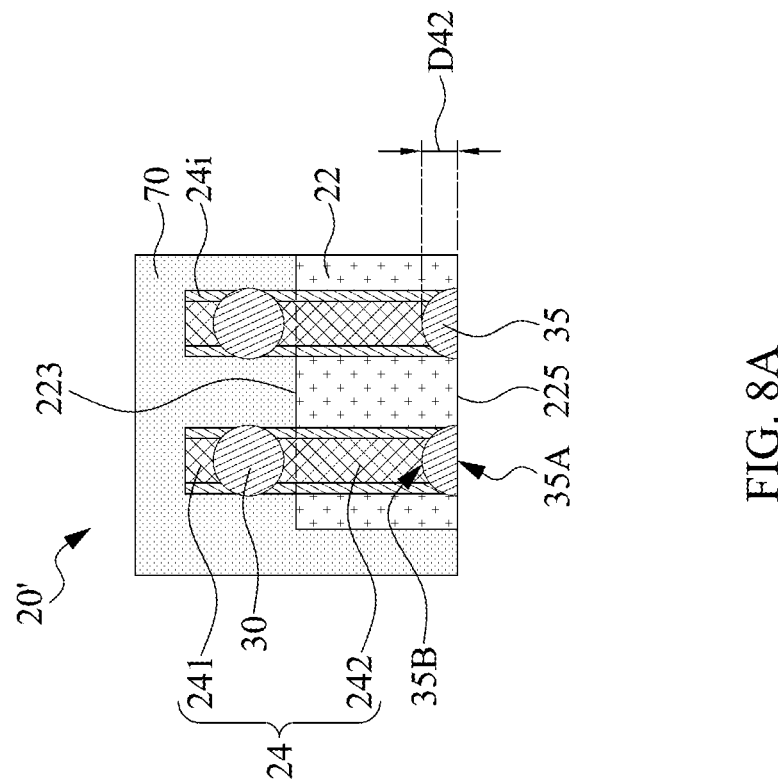
FIG. 8A is a schematic perspective view of a portion of a package structure in accordance with some embodiments of the present disclosure.

FIG. 8A is a schematic perspective view of a portion of a package structure 3 in accordance with some embodiments of the present disclosure. FIG. 8A illustrates the electronic component 20, the dielectric layer 70, and the connection elements 30 and 35.

The connection element 35 may be embedded in the magnetic layer 22. The lateral surface 35A (the same reference of the contact interface 35A for brevity) and a side surface 225 of the magnetic layer 22 may be substantially coplanar. The lateral surface 35A may be substantially flat. The lateral surface 35A and the side surface 225 may be formed by the same singulating operation. The lateral surface 35B (the same reference of the contact interface 35A for brevity) may have a curved profile. The lateral surface 35B may be formed by a mechanical drilling operation during the formation of the connection element 35. As such, a surface roughness of the lateral surface 35A is different from a surface roughness of the lateral surface 35B. The surface roughness of the lateral surface 35A (formed by sawing) may be smaller than that of the lateral surface 35B (formed by mechanical drilling). In FIG. 8A, the diameter D42 of the connection element 35 may be half of the diameter D2 of the connection element 30. In some embodiments, the lateral surface 223 opposite to the side surface 225 of the magnetic layer 22. A surface roughness of the side surface 225 of the magnetic layer 22 is different from a surface roughness of the lateral surface 223 of the magnetic layer 22, because the side surface 225 is formed by a singulating operation of the electronic component 20.

Figure 8B:
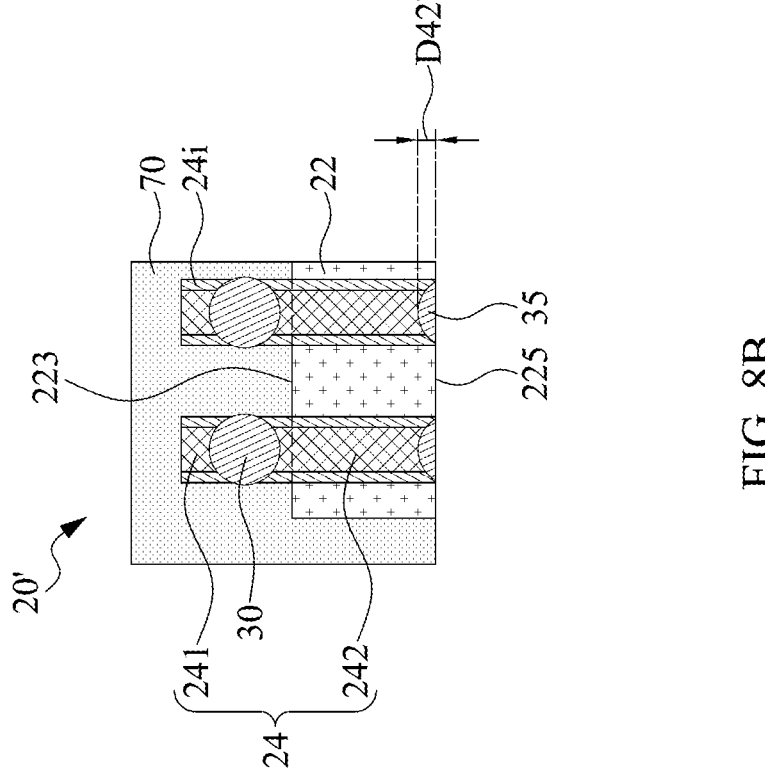
FIG. 8B is a schematic perspective view of a portion of a package structure in accordance with some embodiments of the present disclosure.

FIG. 8B is a schematic perspective view of a portion of a package structure 3 in accordance with some embodiments of the present disclosure. FIG. 8B illustrates the electronic component 20, the dielectric layer 70, and the connection elements 30 and 35.

The connection element 35 may be embedded in the conductive wire 24. In FIG. 8B, the connection element 35 may have a diameter D42' less than the diameter D42 in FIG. 8A. The diameter D42' may be less than half the diameter D2 of the connection element 30.

Figure 8C:
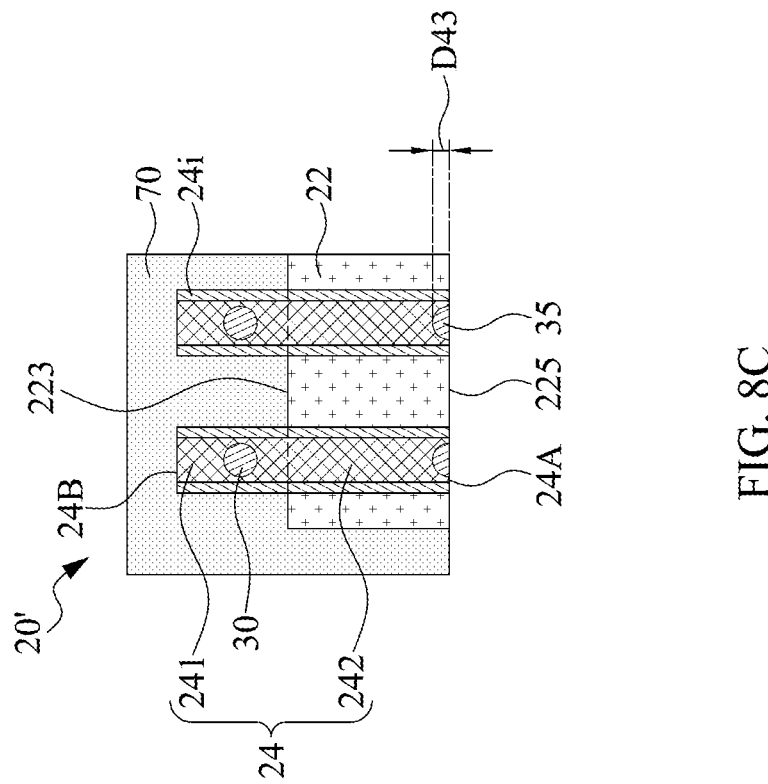
FIG. 8C is a schematic perspective view of a portion of a package structure in accordance with some embodiments of the present disclosure.

FIG. 8C is a schematic perspective view of a portion of a package structure in accordance with some embodiments of the present disclosure. FIG. 8C illustrates the electronic component 20, the dielectric layer 70, and the connection elements 30 and 35.

The connection element 35 may be embedded in the conductive wire 24. As shown in FIG. 8C, the connection element 35 may have a width (or diameter) D43 less than the diameter D2 in FIG. 8A. The lateral surface 35B is surrounded by the conductive wire 24. The conductive wire 24 has a lateral surface 24A and a lateral surface 24B opposite to the lateral surface 24A. The lateral surface 35A of the connection element 35 and the lateral surface 24A of the conductive wire 24 may be substantially coplanar. The lateral surface 35A and the lateral surface 24A may be formed by the same singulating operation. A surface roughness of the lateral surface 24A of the conductive wire 24 may be different from a surface roughness of the lateral surface 24B of the conductive wire 24, because the lateral surface 24A is formed by a singulating operation of the electronic component 20.

Figure 9:
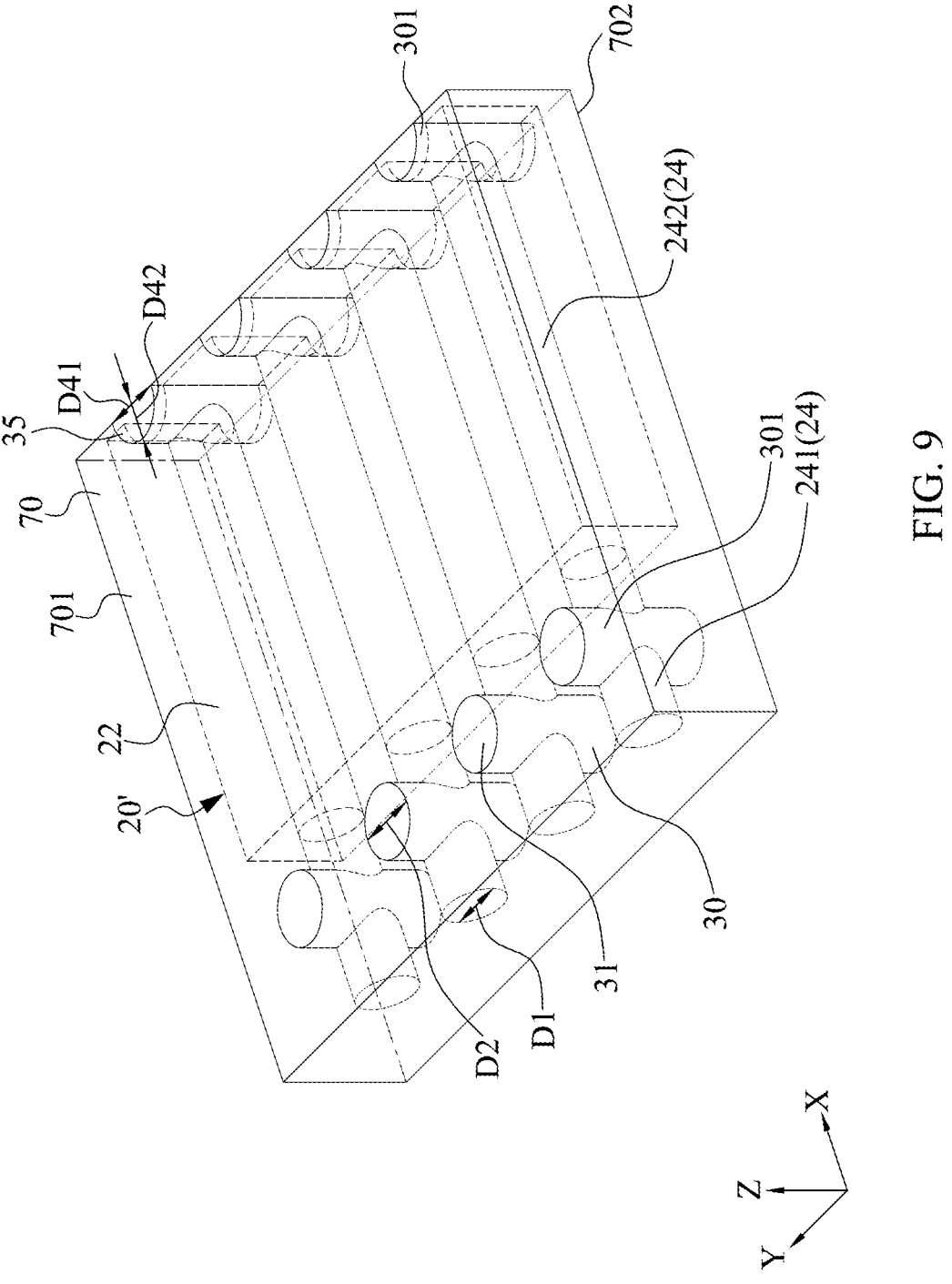
FIG. 9 is a schematic perspective view of a portion of a package structure in accordance with some embodiments of the present disclosure.

FIG. 9 is a schematic perspective view of a portion of a package structure 3 in accordance with some embodiments of the present disclosure. In some embodiments, FIG. 9 is a schematic perspective view of the electronic component 20, the connection elements 30 and 35, and the dielectric layer 70 in FIG. 1.

The side surface 225 of the magnetic layer 25 may be exposed by the dielectric layer 70. The connection element 35 may have a semicircular shape in a top view. The magnetic layer 22 may be defined by the connection element 35 as having a semi-cylindrical outer surface. The connection element 35 may have a width (or a diameter) D41 along the Y-axis perpendicular to the X-axis where the width D42 is defined. The width D41 may be similar to or the same as the width D1 of the connection element 30. The width D41 may be greater than the width D42. In some embodiments, the width D41 may be twice of the width D42.

FIG. 10A1, FIG. 10A2, FIG. 10B1, FIG. 10B2, FIG. 10C1, FIG. 10C2, FIG. 10D1, FIG. 10D2, FIG. 10E1, FIG. 10E2, FIG. 10F1, FIG. 10F2, FIG. 10G, FIG. 10H, FIG. 10I, FIG. 10J, and FIG. 10K illustrate various operations in a method of manufacturing a package structure 3 in accordance with some embodiments of the present disclosure. The operations in FIGS. 10A1 and 10A2 may follow the operations in FIGS. 4B1 and 4B2.

Referring to FIG. 10A1 which is a perspective top view, and FIG. 10A2, which is a cross-section along an axis 10A2-10A2' in FIG. 10A1, through holes 70S may be formed to penetrate the dielectric layer 70 and the protruding portions 241 and 243 of the conductive wires 24 and through holes 20S may be formed to penetrate the electronic component 20 and the portions 242 of the conductive wires 24. The portions 241 and 243 may be exposed by the through holes 70S. The through holes 70S may have a circular shape in a top view. The formation of the through holes 70S may include a single step mechanical drilling or a multiple step mechanical drilling to form the latch structure LF as discussed in FIG. 3B. The portions 242 may be exposed by the through holes 20S. The through holes 20S may have a circular shape in a top view. The formation through holes

70S may include mechanical drilling. The through holes 20S and 70S may be formed in the same operation or different operations.

Referring to FIG. 10B1 which is a perspective top view, and FIG. 10B2, which is a cross-section along an axis 10B2-10B2' in FIG. 10B1, connection elements 36 may be formed in the through holes 20S. In some embodiments, conductive gel or paste is filled in the through holes 20S, and then a curing operation is performed on the conductive gel or the conductive paste to form the connection elements 36. In some embodiments, solder may be filled in the through holes 20S.

Referring to FIG. 10C1 which is a perspective top view, and FIG. 10C2, which is a cross-section along an axis 10C2-10C2' in FIG. 10C1, a conductive material (e.g., a conductive gel, a solder, or electroplated material) may be formed in the through holes 70S to form connection elements 30 and 30' penetrating the dielectric layer 70 and in contact with the conductive wire 24. The connection element 30 (or 30') may have a circular shape in a top view. In some embodiments, a seed layer along the sidewall of the through holes 70 may be formed prior to the formation of the conductive material. The connection element 30 and the connection element 36 may be composed of different materials.

The operations of FIGS. 10D1 and 10D2 illustrate alternative operations of FIGS. 10B1, 10B2, 10C1, and 10C2. Referring to FIG. 10D1 which is a perspective top view, and FIG. 10D2, which is a cross-section along an axis 10D2-10D2' in FIG. 10D1, a conductive material (e.g., a conductive gel, a conductive paste, or a solder) may be formed in the through holes 70S to form connection elements 30 and 30' and formed in the through holes 20S to form connection elements 37. The connection element 30 and the connection element 37 may be composed of a same material. The connection elements 30, 30', and 37 may be formed in the same operations.

Referring to FIG. 10E1 which is a perspective top view, and FIG. 10E2, which is a cross-section along an axis 10E2-10E2' in FIG. 10E1, the connection element 37 may be cut (or singulated) in a path S11 perpendicular to a length 24L of the conductive wire 24 to form a plurality of sub-electronic components and a plurality of connection elements 35. Furthermore, the electronic component 20 may be cut (or singulated) in a path S12 to form a plurality of sub-electronic components.

FIG. 10F1 which is a perspective top view, and FIG. 10F2, which is a cross-section along an axis 10F2-10F2' in FIG. 10F1 illustrate one of the sub-electronic components with the connection element 30, the dielectric layer 70, and the connection element 35, which, for example, may be half the connection element 37.

In some embodiments, the electronic component 20 may be cut in a mechanical manner, for example, by a wheel cutter. The cutting in the paths S11 and S12 may be continuous, such that the electronic component 20 may be cut to form four sub-electronic components 20'. By singulating the electronic component 20' which has been equipped with the connection elements 30 and 35, a plurality of sub-electronic components 20' can be manufactured based on the required inductance value. The sub-electronic components 20' with the required or customized inductance value (the same or different from each other) can be integrated with different types of substrates, devices, or systems. This improve the throughput of the inductor. In some embodiments, the electronic component 20 may be divided into N sub-electronic components 20', wherein N is a positive integer.

Referring to FIG. 10G, the electronic component 20' with the connection elements 30 and 35 and the dielectric layer 70 illustrated in FIG. 10F2 may be disposed in the cavity 10C and fixed with the adhesive layer 720.

Figure 10H:
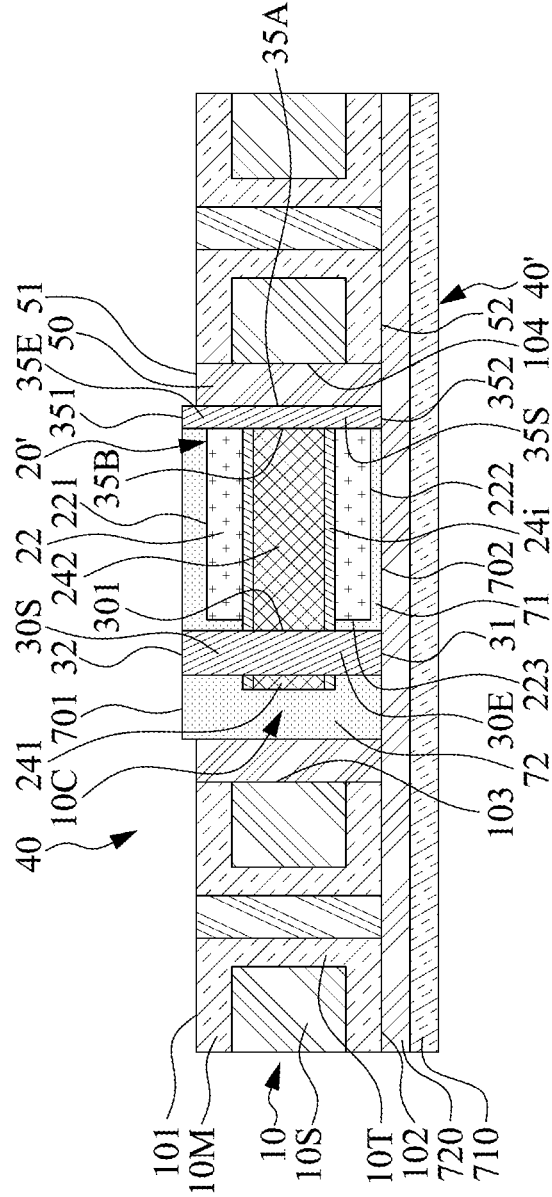
Figure 10H:
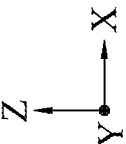

Referring to FIG. 10H, a dielectric layer 50 may be formed in the cavity 10C to contact the dielectric layer 70, the electronic component 20', and the connection element 35. In some embodiments, the dielectric layer 50 may be flowable (e.g., fluid). The dielectric layer 50 may be thermally and/or optically cured to solidify. In some embodiments, the dielectric layer 50 may be configured to fix the electronic component 20 in the cavity 10C. In some embodiments, a grinding operation may be performed to remove excess materials of the dielectric layer 50 over the surface 101 of the substrate 10 and the surface 221 of the electronic component 20' to expose the conductive layers 10M and the connection elements 30 and 35.

Referring to FIG. 10I, the electronic component 20', the dielectric layers 50 and 70 may be ground to provide the connection elements 30 and 35 with a flat or planarized surface (e.g., the surface 31 or the surface 351) for improving electrical connection between the connection element 30 and the conductive via 41 which will be formed subsequently. The magnetic layer 22 is intact during the grinding. An upper surface 701 of the dielectric layer 70, an upper surface 51 of the dielectric layer 50, and the surfaces 31 and 351 may be substantially coplanar.

Referring to FIG. 10J, an insulation layer 60 may be formed on the surface 101 of the substrate 10, the carrier 710 and the adhesive layer 720 may be removed, and then an insulation layer 60' may be formed on the surface 102 of the substrate 10. In some embodiments, the insulation layers 60 (or 60') may be formed by lamination. In some embodiments, the insulation layer 60 (or 60') may be formed over the dielectric layers 50 and 70.

Figure 10K:
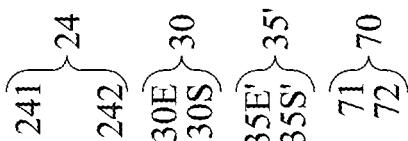
Figure 10K:
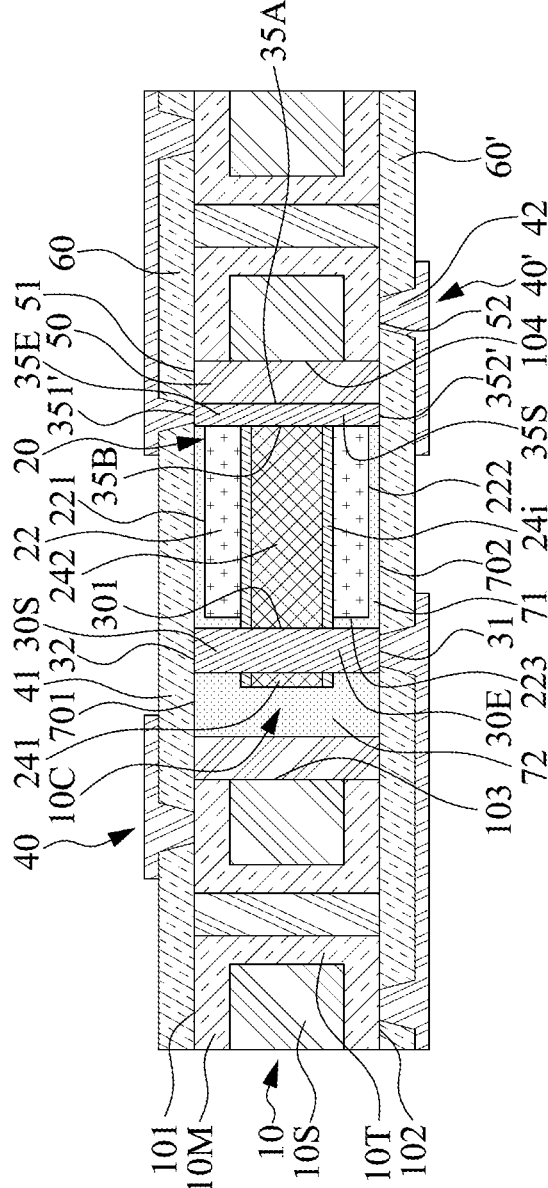
Figure 10K:
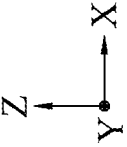

Referring to FIG. 10K, portions of the insulation layers 60 may be removed to form vias exposing portions of the surfaces 101 and 102 of the substrate 10, and conductive patterns 40 and 40' may be formed on the insulation layers 60. The vias may be formed by one or more laser drilling operations. In some embodiments, conductive materials may be formed on the surfaces 101 and 102 and in the vias of the insulation layers 60 by one or more plating operations to form the conductive patterns 40 and 40' and the conductive vias 41 and 42. Furthermore, a conductive via 42 of the conductive pattern 40' may be formed through the insulation layer to electrically connect to the connection element 30. Furthermore, a conductive via 41 of the conductive pattern 40 may be formed through the insulation layer to electrically connect to the connection element 35. As such, the package structure 3 illustrated in FIG. 2 is formed.

According to some embodiments of the present disclosure, the through hole 20S for forming the connection element 35 (or 36, 37) is formed by a mechanical drilling operation rather than a laser drilling operation, such that re-melting of the magnetic layer 22 due to the relatively high temperature from the laser operation is prevented, and thus formation of undesired irregular morphology of the inner wall of the through hole 20S can be prevented. Therefore, it is advantageous to the formation of the connection element 35 (or 36, 37) in the through hole 20S. As well, the through hole 20S penetrates the electronic component 20, thus debris formed during the mechanical drilling operation can be discharged out the through hole 20S easily, and therefore formation of defects on the connection element 35 (or 36, 37) which could have been caused by debris in the through hole 20S can be effectively prevented.

In addition, a via or a through hole formed by a laser drilling operation usually has a tapered shape with the tapered end at the bottom contacting the target feature and a relatively large opening at top, which may lead to a relatively large contact area, with the relatively large aspect ratio of the via or the through hole formed by a laser drilling operation disadvantageous to the plating operation for forming a conductive layer within the via or the through hole. In contrast, according to some embodiments of the present disclosure, with formation of the through hole 20S by mechanical drilling, the aforesaid issues can be mitigated or prevented, and thus yield can be increased.

Moreover, according to some embodiments of the present disclosure, the connection element 35 (or 36, 37) is formed by filling conductive gel or paste in the through hole 20S rather than plating a metal material in the through hole 20S, whereby the magnetic layer 22 can be protected from damage or etching by the plating chemical solution.

Furthermore, laser drilling may be unable to form a relatively flat or planarized surface for electrical contact. For example, the conductive wire exposed by a laser-drilled via may still have a curved surface rather than a flat surface. In contrast, according to some embodiments of the present disclosure, with formation of the through hole 20S by mechanical drilling, portions of the conductive wire 24 that are exposed to the through hole 20S to contact the connection element 30 have relatively flat and large contact surfaces, and the connection element 35 (or 36, 37) is formed by filling conductive gel or paste rather than plating a conductive material, providing good electrical connection between the conductive wire 24 and the conductive via 41 through the connection element 35 (or 36, 37).

Furthermore, according to some embodiments of the present disclosure, the electrical connection between the electronic component 20 and the substrate 10 can be achieved by simply performing mechanical drilling and conductive gel/paste filling without modifying a large number of steps of the existing process, the manufacturing process is simplified, and the time required is reduced.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A package structure, comprising:

an electronic component comprising a conductive wire and a magnetic layer encapsulating the conductive wire;

a first connection element electrically connected to the conductive wire, wherein the first connection element is disposed outside the magnetic layer; and an encapsulant encapsulating the conductive wire and separating the first connection element from the magnetic layer, wherein the first connection element has a first surface exposed by an upper surface of the encapsulant and a second surface exposed by a lower surface, opposite to the upper surface, of the encapsulant.

2. The package structure as claimed in claim 1, wherein the first connection element penetrates the conductive wire.

3. The package structure as claimed in claim 2, wherein the first connection element extends beyond a top and a bottom of the magnetic layer, the top of the magnetic layer is over the conductive wire, and the bottom of the magnetic layer is below the conductive wire.

4. The package structure as claimed in claim 2, wherein the conductive wire has a first segment and a second segment spaced apart from the first segment by the first connection element, and wherein the first connection element and the first segment define a first contact surface fully penetrating the conductive wire, and the first connection element and the second segment define a second contact surface fully penetrating the conductive wire.

5. The package structure as claimed in claim 1, wherein the conductive wire defines a step structure in contact with the first connection element.

6. The package structure as claimed in claim 5, wherein a portion of the conductive wire is vertically surrounded by the first connection element.

7. The package structure as claimed in claim 1, further comprising a substrate having a side surface facing the electronic component, wherein the electronic component is embedded in the substrate, and the first connection element is disposed between the side surface of the substrate and the magnetic layer.

8. The package structure as claimed in claim 7, further comprising a first dielectric layer and a second dielectric layer disposed between the side surface of the substrate and the magnetic layer.

9. The package structure as claimed in claim 8, wherein the first dielectric layer is separated from the side surface of the substrate by the second dielectric layer.

* * * * *